(12) United States Patent
Qu et al.

(10) Patent No.: US 11,049,975 B2
(45) Date of Patent: Jun. 29, 2021

(54) DUAL-GATE THIN FILM TRANSISTOR, MANUFACTURING METHOD THEREOF, ARRAY SUBSTRATE AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Lianjie Qu, Beijing (CN); Jinchao Bai, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 498 days.

(21) Appl. No.: 15/780,926

(22) PCT Filed: Aug. 21, 2017

(86) PCT No.: PCT/CN2017/098307
§ 371 (c)(1),
(2) Date: Jun. 1, 2018

(87) PCT Pub. No.: WO2018/126703
PCT Pub. Date: Jul. 12, 2018

(65) Prior Publication Data
US 2020/0287052 A1    Sep. 10, 2020

(30) Foreign Application Priority Data
Jan. 5, 2017   (CN) .......................... 201710008241.4

(51) Int. Cl.
*H01L 21/00*    (2006.01)
*H01L 21/84*    (2006.01)
(Continued)

(52) U.S. Cl.
CPC .... *H01L 29/78645* (2013.01); *H01L 27/3276* (2013.01); *H01L 29/6675* (2013.01);
(Continued)

(58) Field of Classification Search
CPC ......... H01L 29/78645; H01L 29/78648; H01L 29/78663; H01L 29/6675; H01L 27/3276;
(Continued)

(56) References Cited

U.S. PATENT DOCUMENTS

2011/0284852 A1    11/2011  Kim et al.
2013/0309808 A1 *  11/2013  Zhang ............... H01L 29/66742
                                                      438/104
(Continued)

FOREIGN PATENT DOCUMENTS

CN    102707523 A    10/2012
CN    103094287 A    5/2013
(Continued)

OTHER PUBLICATIONS

International Search Report and Written Opinion dated Oct. 27, 2017; PCT/CN2017/098307.
(Continued)

*Primary Examiner* — Calvin Y Choi

(57) ABSTRACT

A dual-gate thin film transistor, a manufacturing method thereof, an array substrate and a display device are provided. The dual-gate thin film transistor includes: a base substrate and a first gate, a first gate insulating layer, an active layer, a second gate insulating layer, a first electrode, a second electrode, a second gate and a connection electrode, formed on the base substrate. The second gate, the first electrode and the second electrode are formed on the same level. The first gate insulating layer includes a first via hole exposing a portion of the first gate, and the connection electrode is
(Continued)

electrically connected with the second gate and is electrically connected with the first gate through the first via hole.

20 Claims, 16 Drawing Sheets

(51) Int. Cl.
    *H01L 29/786*     (2006.01)
    *H01L 27/32*     (2006.01)
    *H01L 29/66*     (2006.01)
    *H01L 51/52*     (2006.01)
    *H01L 51/56*     (2006.01)
    *H01L 33/42*     (2010.01)

(52) U.S. Cl.
    CPC .. *H01L 29/78648* (2013.01); *H01L 29/78663* (2013.01); *H01L 51/5237* (2013.01); *H01L 51/56* (2013.01); *H01L 27/3262* (2013.01); *H01L 33/42* (2013.01); *H01L 2251/305* (2013.01)

(58) Field of Classification Search
    CPC ................. H01L 51/5237; H01L 51/56; H01L 2251/305; H01L 33/42
    See application file for complete search history.

(56) References Cited

U.S. PATENT DOCUMENTS

| | | | |
|---|---|---|---|
| 2015/0108481 A1* | 4/2015 | Khang | ............ H01L 29/78645 257/59 |
| 2015/0270408 A1 | 9/2015 | Song | |
| 2016/0268316 A1 | 9/2016 | Kim et al. | |
| 2017/0141140 A1 | 5/2017 | Li | |
| 2017/0213916 A1 | 7/2017 | Niu et al. | |

FOREIGN PATENT DOCUMENTS

| | | |
|---|---|---|
| CN | 104216186 A | 12/2014 |
| CN | 104952880 A | 9/2015 |
| CN | 105514120 A | 4/2016 |
| CN | 105573549 A | 5/2016 |
| CN | 106684155 A | 5/2017 |

OTHER PUBLICATIONS

The Second Chinese Office Action dated Aug. 23, 2018; Appln. No. 201710008241.4.

* cited by examiner

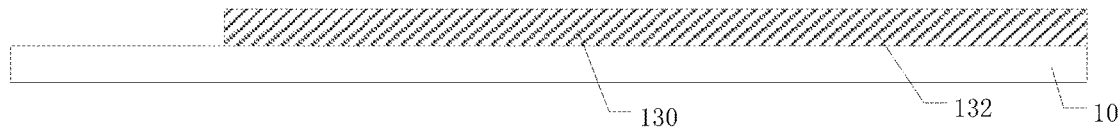
Fig. 2a1
Fig. 2b1
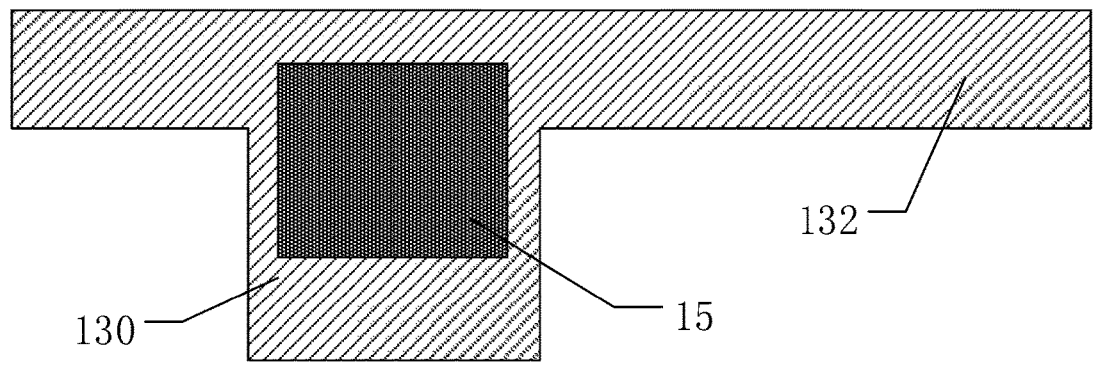
Fig. 2c1
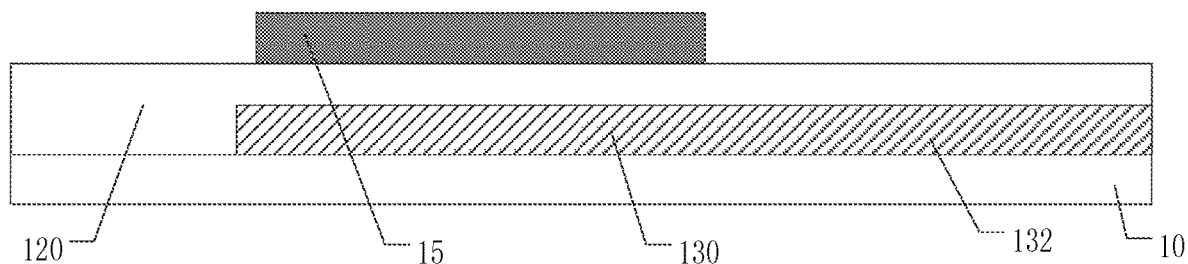
Fig. 2d1

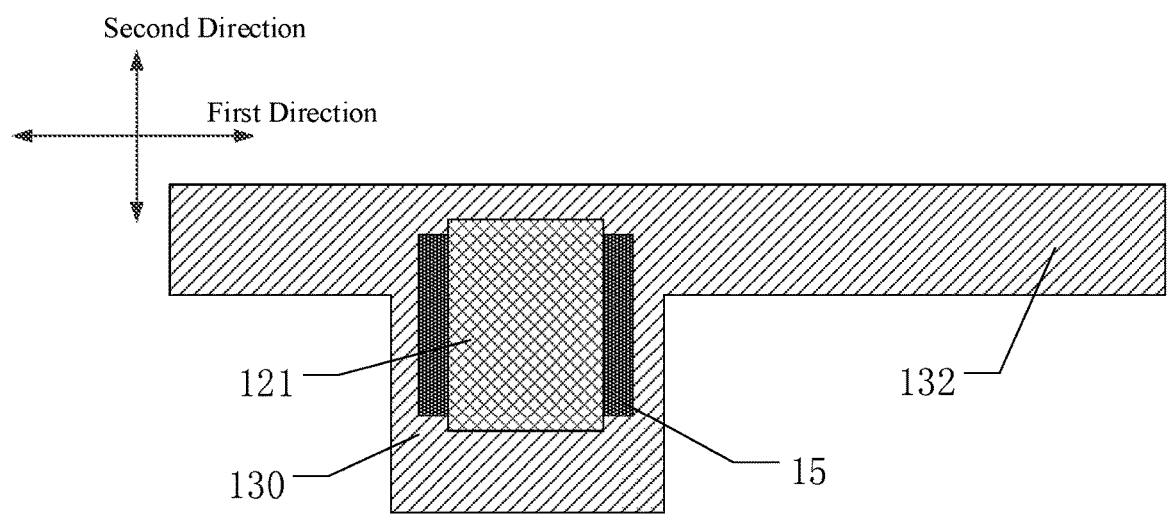
Fig. 2e1
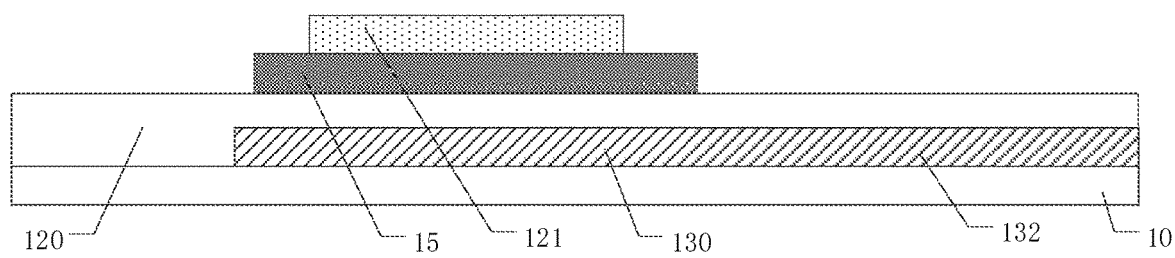
Fig. 2f1

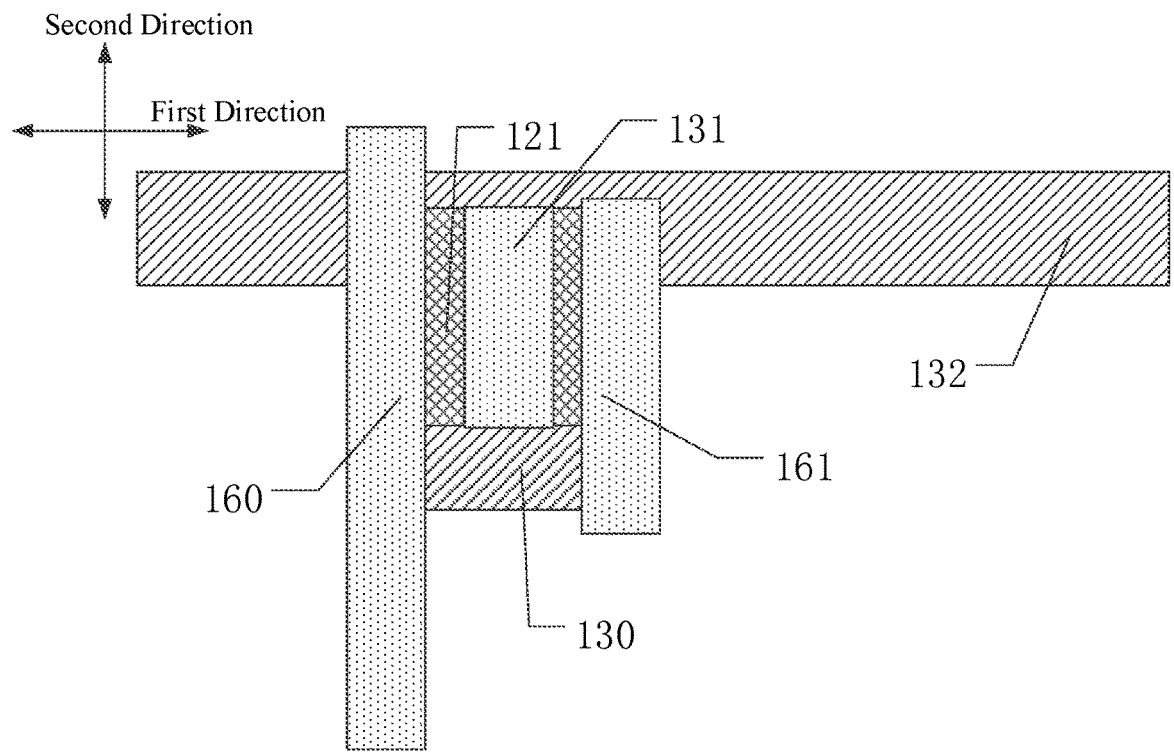
Fig. 2g1
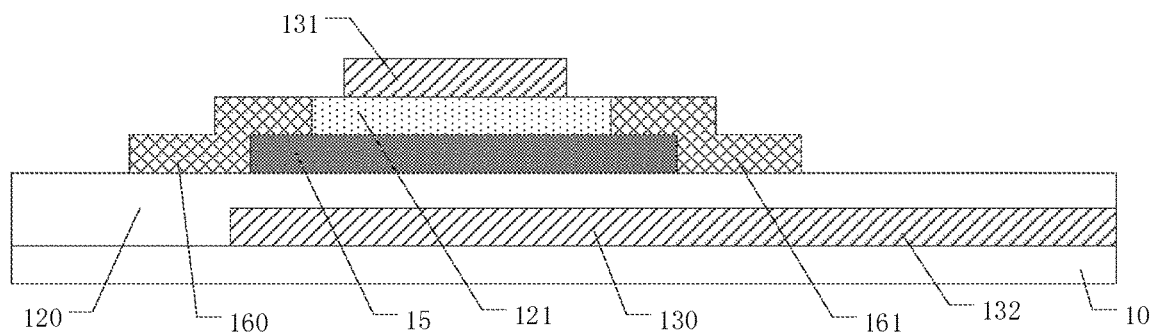
Fig. 2h1

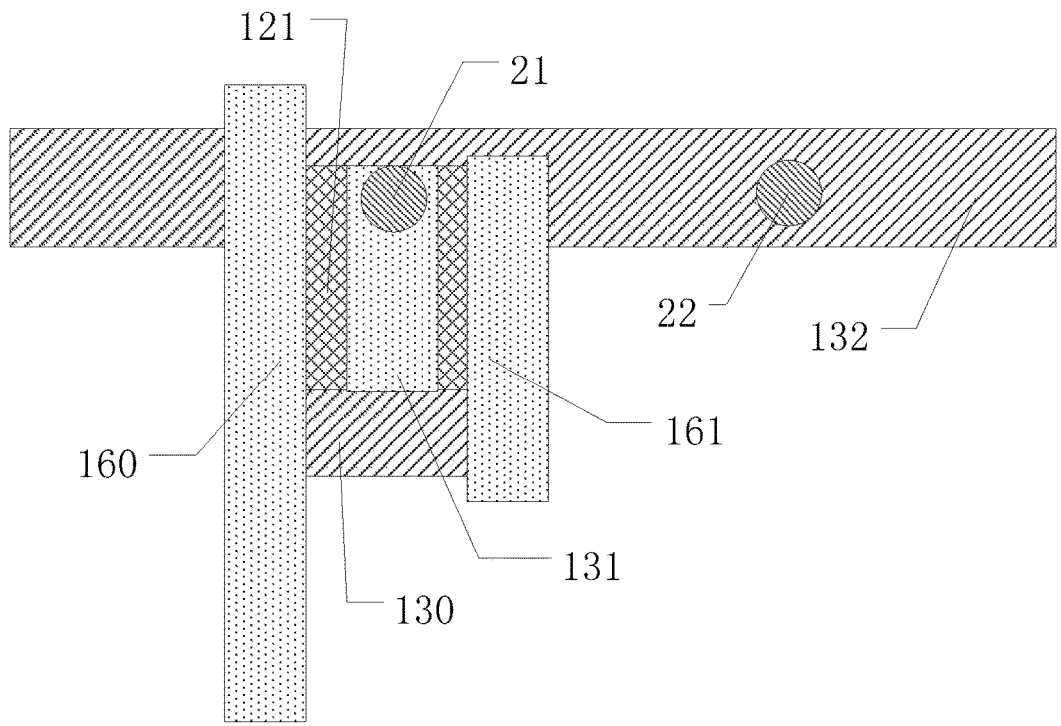
Fig. 2i1
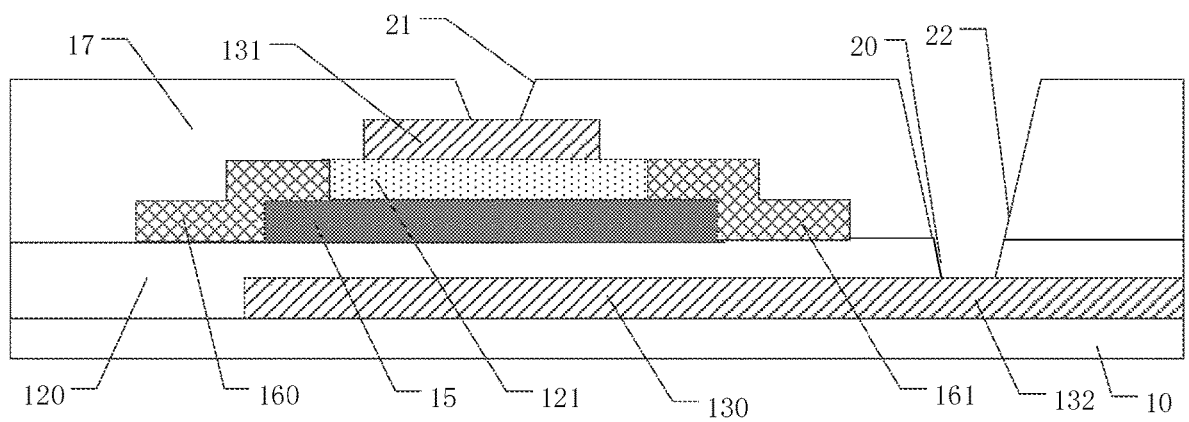
Fig. 2j1

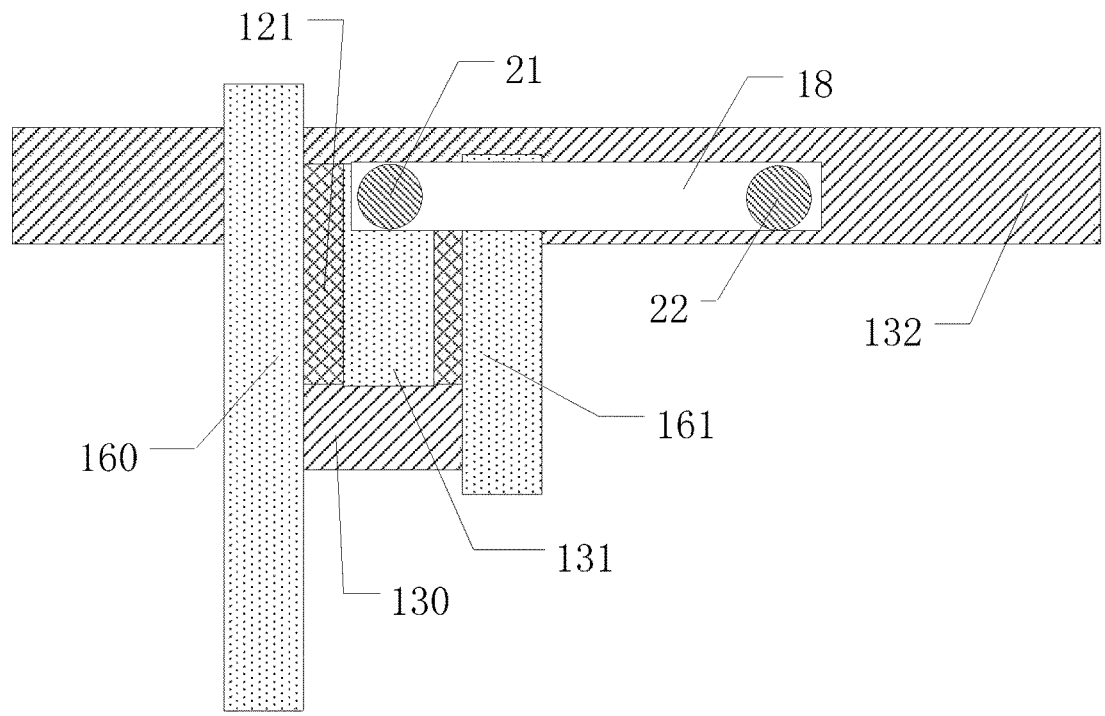
Fig. 2k1
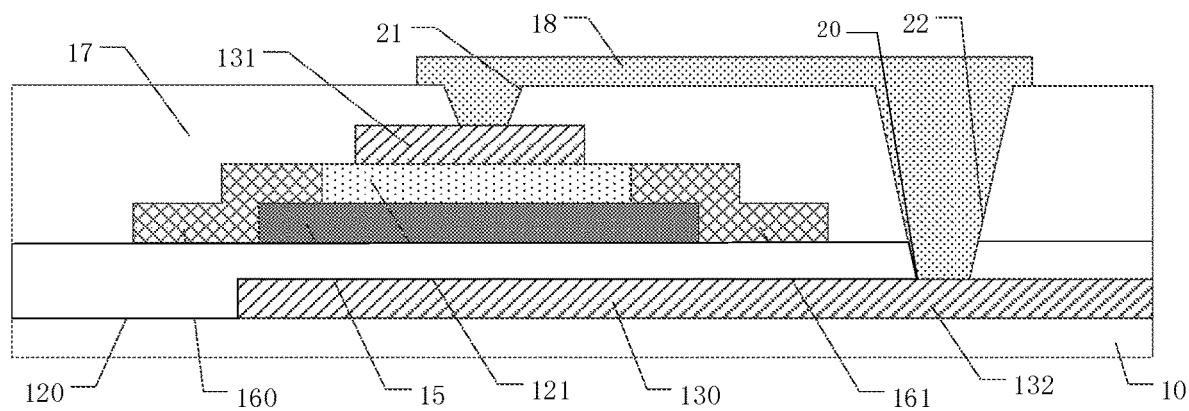
Fig. 2l1

Fig. 3b1

DUAL-GATE THIN FILM TRANSISTOR, MANUFACTURING METHOD THEREOF, ARRAY SUBSTRATE AND DISPLAY DEVICE

The present application claims priority of Chinese Patent Application No. 201710008241.4 filed on Jan. 5, 2017, the disclosure of which is hereby entirely incorporated by reference as a portion of the present application.

TECHNICAL FIELD

Embodiments of the present disclosure relate to a dual-gate thin film transistor, a manufacturing method thereof, an array substrate and a display device.

BACKGROUND

With the development of display technologies, flat panel display devices such as liquid crystal displays (LCDs) are increasingly and widely used in various consumer electronics products, such as mobile phones, TVs, digital cameras, laptops and the like due to their advantages of high image quality, low power consumption, small thickness, various applications and etc. Thin film transistors are widely used as a switching component and to drive components in various display devices. With the development of portable electronic products, size of the display devices is getting smaller and smaller. In order to meet the requirements in manufacturing smaller and smaller display devices, size of the display device should be reduced, very important semiconductor materials used in thin film transistors are also required performance improvement in performance as the size of the display device decreases.

A conventional thin film transistor generally has a single gate structure, and is poor at stability and the like. In order to solve a problem of the stability of the single gate thin film transistor, a new dual-gate thin film transistor technology has been developed, wherein a top-gate and a bottom-gate are respectively disposed on two sides of an active layer, and the active layer is driven by the dual gates, thus, the threshold voltage can be easily controlled, and the same time, the carrier mobility can be also be significantly improved.

SUMMARY

At least one embodiment of the present disclosure provides a dual-gate thin film transistor, a manufacturing method for the dual-gate thin film transistor, an array substrate and a display device.

At least one embodiment of the present disclosure provides a dual-gate thin film transistor, comprising: a base substrate; a first gate disposed on the base substrate; a first gate insulating layer disposed on the first gate, the first gate insulating layer comprising a first via hole exposing a portion of the first gate; an active layer disposed on the first gate insulating layer, the active layer and the first gate at least partially overlapping with each other in a direction perpendicular to the base substrate; a second gate insulating layer disposed on the active layer; a first electrode and a second electrode, both of which are disposed in contact with the active layer; a second gate disposed on the second gate insulating layer, the second gate and the active layer at least partially overlapping with each other in a direction perpendicular to the base substrate, and the second gate, the first electrode and the second electrode formed on a same level; and a connection electrode electrically connected with the second gate and electrically connected with the first gate through the first via hole.

In the dual-gate thin film transistor, the first electrode, the second electrode and the second gate are formed through a single photolithography process, and the connection electrode is electrically connected with the first gate and the second gate so as to achieve a structure of dual gates, thereby reducing the amount of the masks used, lowering the production cost, improving the yield rate, enhancing the stability and the reliability of the thin film transistor and optimizing the response speed of the thin film transistor.

For example, the dual-gate thin film transistor according to an embodiment of the present disclosure further comprises a first passivation layer, wherein the first passivation layer is disposed on the second gate, the first passivation layer comprises a second via hole exposing a portion of the second gate and a third via hole exposing the first via hole, the connection electrode is disposed on the first passivation layer, is electrically connected with the second gate through the second via hole and electrically connected with the first gate through the third via hole and the first via hole.

For example, in the dual-gate thin film transistor according to an embodiment of the present disclosure, the first electrode and the second electrode are disposed on the second gate insulating layer, the second gate insulating layer comprises a fourth via hole and a fifth via hole which expose at least a portion of the active layer and are located on respective sides of the second gate, the first electrode is electrically connected with the active layer through the fourth via hole, and the second electrode is electrically connected with the active layer through the fifth via hole.

For example, in the dual-gate thin film transistor according to an embodiment of the present disclosure, the second gate insulating layer partially covers the active layer, in a direction parallel to the base substrate, on both sides of the second gate, the active layer has a first end and a second end which are at least partially uncovered by the second gate insulating layer, the first electrode overlaps the active layer through the first end, and the second electrode overlaps the active layer through the second end.

For example, in the dual-gate thin film transistor according to an embodiment of the present disclosure, the connection electrode is made of a transparent conductive material.

For example, in the dual-gate thin film transistor according to an embodiment of the present disclosure, the second gate, the first electrode and the second electrode can be made of one or more selected from a group consisting of molybdenum, molybdenum alloy, copper, copper alloy, aluminum, aluminum alloy, titanium and titanium alloy.

For example, in the dual-gate thin film transistor according to an embodiment of the present disclosure, the active layer is an amorphous silicon layer, a polysilicon layer, or a metal oxide semiconductor layer.

At least one embodiment of the present disclosure provides an array substrate comprising any one of the dual-gate thin film transistors as described above.

For example, the array substrate according to an embodiment of the present disclosure further comprises a gate line disposed on the base substrate, wherein the gate line is electrically connected with the first gate, the first via hole exposes a portion of the gate line, and the connection electrode is electrically connected with the second gate and is electrically connected with the gate line through the first via hole.

For example, the array substrate according to an embodiment of the present disclosure further comprises a pixel electrode or a common electrode, wherein the pixel electrode or the common electrode is formed on a same level as the connection electrode.

In the array substrate according to embodiments of the present disclosure, the connection electrode of the dual-gate thin film transistor and the pixel electrode or the common electrode of the array substrate are formed of one transparent conductive film through a single photolithography process, thereby simplifying the manufacturing process, making the structure of the array substrate simplifier and efficiently improving the yield rate.

For example, in the array substrate according to an embodiment of the present disclosure, the pixel electrode and the common electrode are formed on a same level or on different levels.

At least one embodiment of the present disclosure provides a method for manufacturing a dual-gate thin film transistor, comprising: providing a base substrate; forming a first gate on the base substrate; forming a first gate insulating layer on the first gate, and forming a first via hole exposing a portion of the gate in the first gate insulating layer; forming an active layer on the first gate insulating layer, the active layer partially overlapping the first gate in a direction perpendicular to the base substrate; forming a second gate insulating layer on the active layer; forming a second gate, a first electrode and a second electrode through one conductive film, wherein the second gate is disposed on the second gate insulating layer and partially overlaps the active layer in a direction perpendicular to the base substrate, and both the first electrode and the second electrode are in contact with the active layer; and forming a connection electrode, which is electrically connected with the second gate and is electrically connected with the first gate through the first via hole.

For example, the method for manufacturing a dual-gate thin film transistor according to an embodiment of the present disclosure further comprises forming a first passivation layer on the second gate; and forming a second via hole and the third via hole in the first passivation layer, wherein the second via hole at least partially exposes the second gate, the third via hole exposes the first via hole, and the connection electrode is electrically connected with the second gate through the second via hole and is electrically connected with the first gate through the third via hole and the first via hole.

For example, in the method for manufacturing a dual-gate thin film transistor according to an embodiment of the present disclosure, the connection electrode is made of a transparent conductive film.

At least one embodiment of the present disclosure provides a display device, comprising any one of the array substrates as described above.

It should be noted that, both the foregoing general description and the following detailed description of the present disclosure are exemplary and illustrative and are intended to further explain the claimed invention.

BRIEF DESCRIPTION OF THE DRAWINGS

In order to clearly illustrate the technical solutions of the embodiments of the disclosure, the drawings of the embodiments will be briefly described in the following; it is obvious that the drawings described below are only related to some embodiments of the disclosure and thus are not limitative of the disclosure.

FIG. 1b is an illustrative cross-sectional structure view of a dual-gate thin film transistor taken along the line AA' in FIG. 1a;

FIG. 2a1-2l1 are flow charts of a method for manufacturing a dual-gate thin film transistor according to another embodiment of the present disclosure;

FIG. 3b is an illustrative cross-sectional structure view of a dual-gate thin film transistor taken along the line BB' in FIG. 3a;

FIG. 3b1 is another illustrative cross-sectional structure view of a dual-gate thin film transistor taken along the line BB' in FIG. 3a;

FIG. 4b is an illustrative cross-sectional structure view of a dual-gate thin film transistor taken along the line CC' in FIG. 4a;

FIG. 5b is a illustrative cross-sectional structure view of a dual-gate thin film transistor taken along the line DD' in FIG. 5a;

DETAILED DESCRIPTION

Figure 1A:
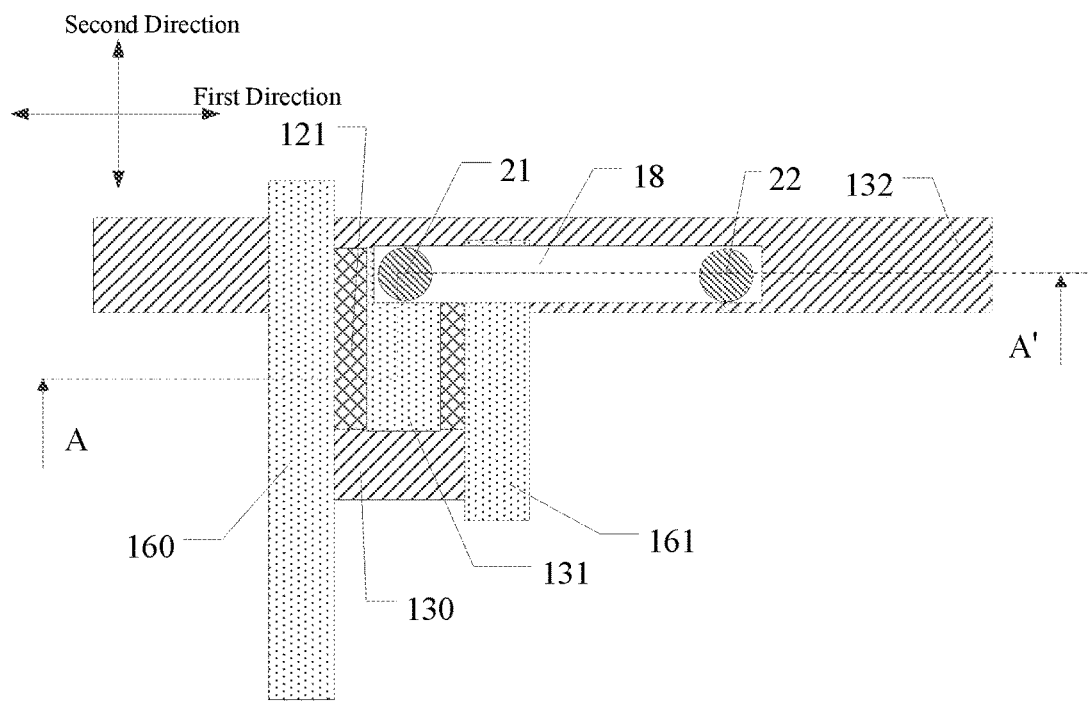
FIG. 1a is a plan view of a dual-gate thin film transistor according to an embodiment of the present disclosure.

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless defined otherwise, technical and scientific terms used in the present disclosure should have the same meaning as commonly understood by one of ordinary skill in the art to which this disclosure belongs. The terms "first," "second," and similar terms used in the present disclosure do not denote any order, quantity or importance, but merely serve to distinguish different components. The use of "including" or "comprising" and the like means that the element or article preceding the word covers elements or items that appear after the word and their equivalents, but do not exclude other elements or items. The words "connected" or "connected" and the like are not limited to physical or mechanical connections but may include electrical connections, whether direct or indirect. "Up," "Down," "Left," "Right," and the like are used only to indicate a relative positional relationship, and the relative positional relationship may also change correspondingly when the absolute positions of the described objects are changed.

Various components or structures in the drawings are not strictly drawn to scale and the size of the various components or structures may be exaggerated or reduced for clarity, such as increasing the thickness of the layers, the width of the electrodes, etc., however, these should not be construed to limit the scope of the disclosure.

Enhancement of the characteristics of a thin film transistor by means of double gates is a new technology that is gradually developed at present. By driving an active layer through dual gates, the carrier mobility of the thin film transistor can be greatly increased, drift of the threshold voltage of the thin film transistor can be reduced, thereby improving the stability of the thin film transistor. However, in manufacturing a dual-gate thin film transistor, one metal patterning process for forming a top-gate and one deposition process for forming an insulating layer for protecting the top-gate are required. More masks are required for the patterning process, the process flow is more complex, and the production cost is increased, thereby seriously affecting the production capacity. And at the same time, more layers and more masks will cause decrease in the yield, thereby limiting the development of the dual-gate thin film transistor.

Embodiments of the present disclosure provide a dual-gate thin film transistor, a manufacturing method for the dual-gate thin film transistor, an array substrate and a display device.

An embodiment of the present disclosure provides a dual-gate thin film transistor, comprising: a base substrate; a first gate disposed on the base substrate; a first gate insulating layer disposed on the first gate, the first gate insulating layer comprising a first via hole exposing a portion of the first gate, an active layer disposed on the first gate insulating layer, the active layer and the first gate at least partially overlapping with each other in a direction perpendicular to the base substrate, a second gate insulating layer disposed on the active layer; a first electrode and a second electrode which are disposed in contact with the active layer; a second gate disposed on the second gate insulating layer, the second gate and the active layer at least partially overlapping with each other in a direction perpendicular to the base substrate, and the second gate, the first electrode and the second electrode formed on a same level; and a connection electrode electrically connected with the second gate and electrically connected with the first gate through the first via hole, and one of the first electrode and the second electrode being a source and the other being a drain.

In the dual-gate thin film transistor, the first electrode, the second electrode and the second gate can be formed through a single photolithography process, and the first gate and the second gate are electrically connected with each other through the connection electrode so as to achieve the dual-gate structure, thereby reducing thickness of the layers and the number of masks, shortening the production time and reducing production costs, effectively improving production capacity and the yield rate, improving stability and reliability of the thin film transistor, optimizing a response speed of the thin film transistor.

An embodiment of the present disclosure provides an array substrate, which comprises the above dual-gate thin film transistor. The array substrate can comprise a plurality of pixel units, and each of the pixel units can comprise the above-mentioned dual-gate thin film transistor. The array substrate can further comprise a pixel electrode or a common electrode. The pixel electrode or the common electrode and the connection electrode are formed of one transparent conductive film through a single patterning process. Therefore, the manufacturing process of the array substrate can be further simplified and the production capacity can be effectively increased.

In an embodiment of the present disclosure, the patterning process is, for example, a photolithography patterning process, and comprises: applying a photoresist film on a structural layer that needs to be patterned, wherein the photoresist film can be coated by spin coating, scrape coating or roller coating, then exposing the photoresist film through a mask, developing the exposed photoresist layer to obtain a pattern of the photoresist, and then etching the structure layer by using the pattern of photoresist as a mask, optionally removing the pattern of photoresist; and finally peeling off the remaining photoresist to form the desired structure.

In the embodiments of the present disclosure, the term "same level" refers to forming a film layer with specific pattern through a single mask forming process and then forming a layer structure through a single pattern processing by means of a same mask. Depending on the particular pattern in the formed layer structure, a single patterning process can comprise multiple exposures, developments or etching processes, and the specific patterns in the formed layer structure can be continuous or discontinuous, and the specific patterns can be disposed at different heights or have different thicknesses.

The dual-gate thin film transistor, the method for manufacturing the dual-gate thin film transistor, the array substrate and the display device according to the embodiments of the present disclosure will be explained in detail in connection with the accompanying drawings. However, the present disclosure is not limited to these specific embodiments FIG. 1a illustrates a plan view of a dual-gate thin film transistor according to an embodiment of the present disclosure, and FIG. 1b shows an illustrative cross-sectional structure view of the dual-gate thin film transistor taken along the line AA' in FIG. 1a.

Figure 1B:
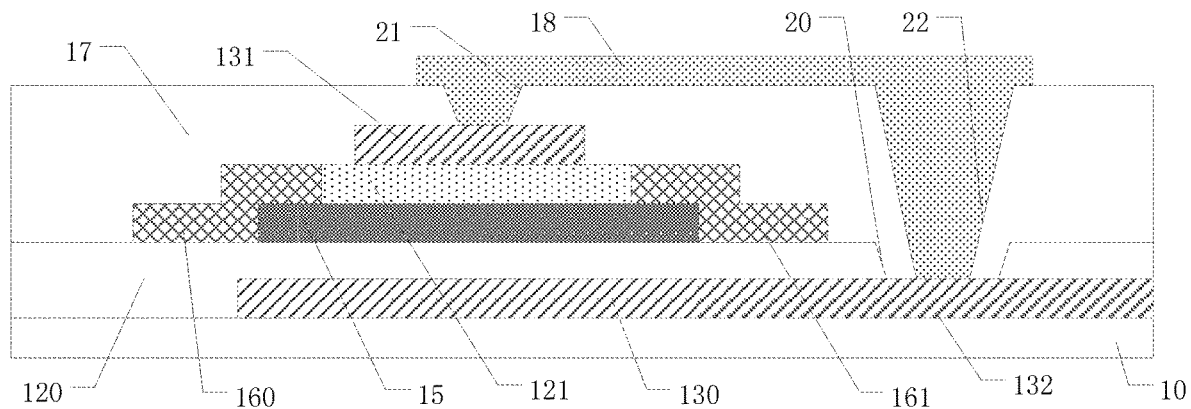

As illustrated in FIG. 1a and FIG. 1b, the dual-gate thin film layer comprises: a base substrate 10, a first gate 130 disposed on the base substrate 10; a first gate insulating layer 120 disposed on the first gate 130, the first gate insulating layer 120 comprising a first via hole 20 exposing a portion of the first gate 130; an active layer 15 disposed on the first gate insulating layer 120, the active layer 15 and the first gate 130 at least partially overlapping in a direction perpendicular to the base substrate 10; a second gate insulating layer 121 disposed on the active layer 15; a first electrode 160 and a second electrode 161 which are disposed to be in contact with the active layer 15; a second gate 131 disposed on the second gate insulating layer 121, the second gate 131 and the active layer 15 at least partially overlapping with each other in a direction perpendicular to the base substrate 10, the second gate 131 and the first electrode 160 and the second electrode 161 formed on the same level; a connection electrode 18 electrically connected with the second gate 131 and electrically connected with the first gate 130 through the first via 20. The first via hole 20 is formed outside a region where the first gate 130 and the active layer 15 overlap with each other.

For example, the second gate 131, the first electrode 160 and the second electrode are formed on the same level, thereby reducing the number of layers and the number of masks, saving production time and lower the production cost, effectively improving production capacity and the yield rate. And at the same time, the first gate 130 and the second gate 131 can also serve to block light, so as to block light in both directions from the first gate 130 and the second gate 131 from being incident on the active layer 15, thereby reducing or eliminating photo-leakage current in the channel of the active layer 15.

In the embodiment as illustrated in FIG. 1a, the second gate insulating layer 121 partially covers the active layer 15. In the first direction, on both sides of the second gate 131, the active layer 15 has a first end and a second end which are at least partially uncovered by the second gate insulating layer 121, and the second gate insulating layer 121 completely covers the active layer 15 in the second direction. The first electrode 160 is overlapped with the active layer 15 t the first end, and the second electrode 161 is overlapped with the active layer 15 at the second end. Here, the first electrode 160 can be a source electrode or a drain electrode, and accordingly the second electrode 161 can be a drain electrode or a source electrode. The second gate 131 is formed on the second gate insulating layer 121 and at least partially overlaps the active layer 15 in a direction perpendicular to the base substrate 10.

For example, the dual-gate thin film transistor according to the embodiment can further comprise a first passivation layer 17, which is disposed on the second gate 131. The first passivation layer 17 can cover the entire thin film transistor so as to protect it. The first passivation layer 17 comprises a second via hole 21 exposing a portion of the second gate 131 and a third via hole 22 exposing the first via hole 20. The connection electrode 18 is disposed on the first passivation layer 17. The connection electrode 18 can be electrically connected with the second gate 131 through the second via hole 21 and electrically connected with the first gate 130 through the third via hole 22 and the first via hole 20.

As illustrated in FIG. 1a, a scanning signal line 132 driving the dual-gate thin film transistor, namely a gate line 132, is formed integrally with the first gate 130. The first via hole 20 disposed in the first gate insulating layer 120 exposes a portion of the first gate 130, maybe a portion of the gate line 132, so that the first via hole 20 exposes a portion of the gate line 132. In the first passivation layer 17, the second via hole 21 exposes a portion of the second gate 131, and the third via hole 22 exposes the first via hole 20, so that the third via hole 22 also exposes a portion of the gate line 132 accordingly. The connection electrode 18 is electrically connected with the second gate 131 and the gate line 132 respectively through the second via hole 21 and the third via hole 22 so that the first gate 130 and the second gate 131 can simultaneously receive the same scanning signal, thereby ensuring that the active layer 15 is simultaneously driven by the dual gates. For example, when an ON signal is applied to the gate line 132, induced charges are generated on a surface of the active layer 15 under collective driving of the first gate 130 and the second gate 131, and an ON state with a low channel resistance and a great current is formed accordingly, and the dual-gate thin film transistor is turned on, and the first electrode 160 and the second electrode 161 are electrically connected with each such that data can be transmitted therebetween. When an OFF signal is applied to the gate line 132, an OFF state with a high channel resistance and a low current is formed in the active layer 15, the dual-gate thin film transistor is turned off, and the first electrode 160 and the second electrode 161 are disconnected, and data can not be transmitted therebetween. The active layer 15 of the dual-gate thin film transistor can be driven by the first gate 130 and the second gate 131 together, so that the active layer 15 can more stably conduct the first electrode 160 and the second electrode 161, thereby improving the stability of the dual-gate thin film transistor, enhancing driving capacity, and reducing drift in the threshold voltage.

For example, the base substrate 10 can be a transparent insulating substrate, such as a glass substrate, a quartz substrate, or other suitable substrate.

For example, material for the first gate 130 can comprise a copper-based metal, an aluminum-based metal, a nickel-based metal, or the like. For example, the copper-based metal is Cu or a stable copper-based metal alloy such as CuZn, CuNi or CuZnNi.

For example, materials for the second gate 131, the first electrode 160 and the second electrode 161 can be one or more of alloys formed by any combination of one or more metals selected from a group consisting of molybdenum, copper, aluminum, and titanium or any other suitable materials. For example, each of the second gate 131, the first electrode 160, and the second electrode 161 can be a single-layer or multi-layer structure.

For example, the active layer 15 can be an amorphous silicon layer, a polysilicon layer, a metal oxide semiconductor layer, or the like. For example, the polysilicon can be a high-temperature polysilicon or a low-temperature polysilicon, and the metal oxide semiconductor can be IGZO, IZO, ZnO, GZO, or the like.

For example, material for the connection electrode 18 can be a transparent conductive material such as ITO, IZO, IGO, GZO, carbon nanotube, or the like.

For example, material for the first gate insulating layer 120 can comprise silicon nitride (SiNx), silicon oxide (SiOx), silicon oxynitride (SiNxOy), or any other suitable materials such as organic resin material.

For example, material for the second gate insulating layer 121 can comprise silicon nitride (SiNx), silicon oxide (SiOx), aluminum oxide ($Al_2O_3$), aluminum nitride (AlN), or any other suitable material such as organic resin material.

For example, material for the first passivation layer 17 can comprise silicon oxide (SiOx), silicon nitride (SiNx), silicon oxynitride (SiOxNy), or any other suitable materials. For example, the first passivation layer 17 can have a single-layer structure made of silicon nitride or silicon oxide, or a multi-layer structure made of silicon nitride and silicon oxide.

A method for manufacturing the dual-gate thin film transistor according to the above embodiments will be described with reference to FIGS. 2a to 2l. FIG. 2b, FIG. 2d, FIG. 2f, FIG. 2h, FIG. 2j and FIG. 2l are the respective cross-sectional views of FIG. 2a, FIG. 2c, FIG. 2e, FIG. 2g, FIG. 2i and FIG. 2k, taken in the direction as illustrated by line A-A' in FIG. 1b. FIGS. 2a, 2c, 2e, 2g, 2i and 2k only illustrate a part of the relevant structure.

Figure 2A:
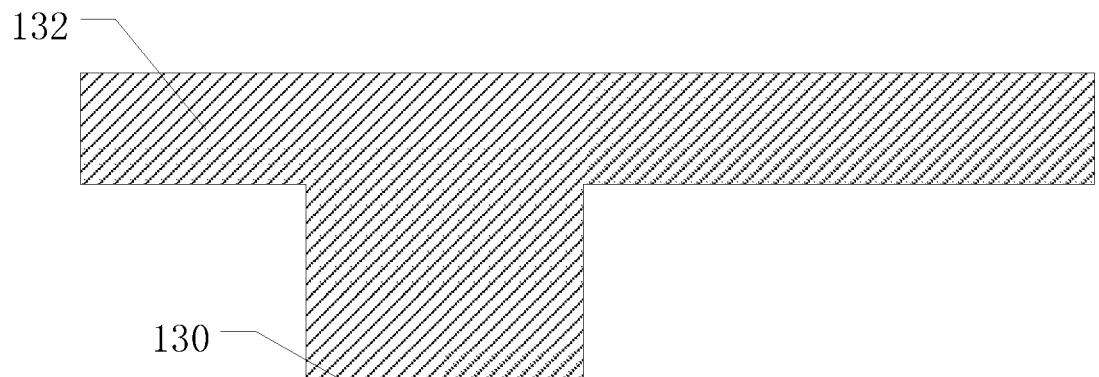
FIG. 2a-2l are flow charts of a method for manufacturing a dual-gate thin film transistor according to an embodiment of the present disclosure.
Figure 2B:
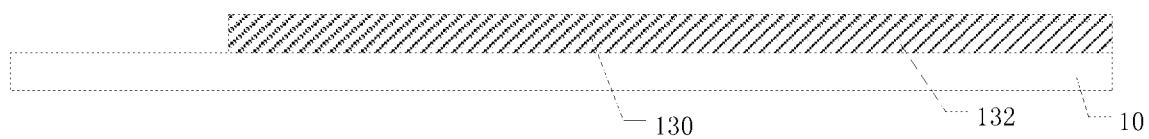

As illustrated in FIGS. 2a and 2b, a base substrate 10 is provided, a metal film is deposited on the base substrate 10, and the metal film is patterned so as to form a first gate 130 on the base substrate 10. It should be noted that a gate line 132 electrically connected with the first gate 130 can be formed simultaneously along with the formation of the first gate 130. For example, in the embodiment, the first gate 130 and the gate line 132 are integrally formed, the first gate 130 is bifurcated from the gate line 132, and a scanning signal is applied to the first gate 130 through the gate line 132.

For example, the base substrate 10 is a transparent insulating substrate. An example of material for the base substrate 10 can be glass, quartz or other suitable materials.

For example, material for the metal film can comprise a copper-based metal, an aluminum-based metal, a nickel-based metal, or the like. For example, the copper-based metal is Cu, or a stable copper-based metal alloy such as CuZn, CuNi, CuZnNi, or the like. For example, the metal film can have a single-layer or multi-layer structure, and accordingly, the first gate 130 and the gate line 132 formed can have a single-layer or multi-layer structure.

Figure 2C:
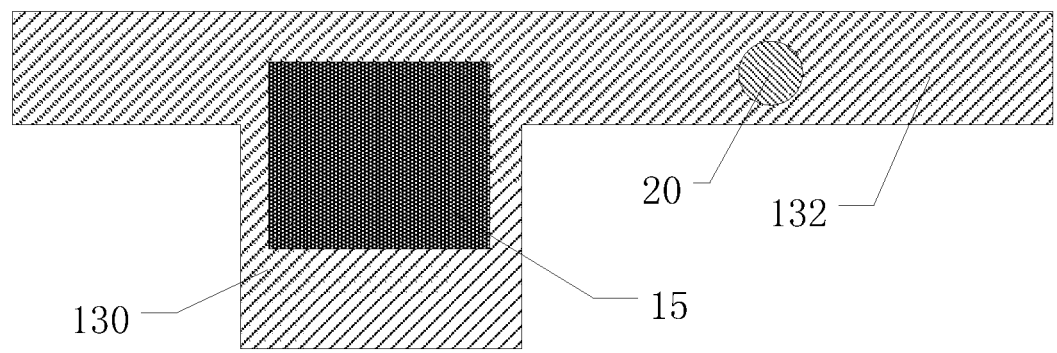
Figure 2D:
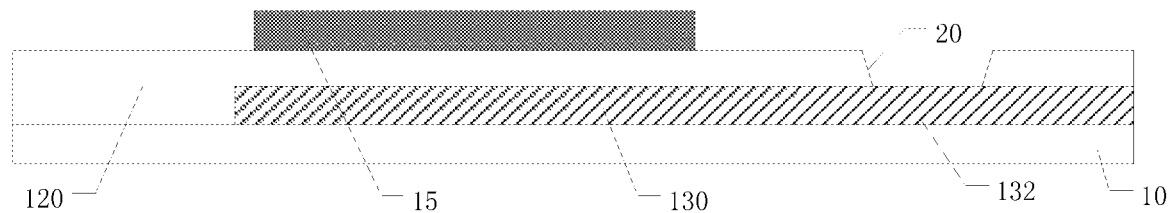

For example, as illustrated in FIGS. 2c and 2d, an insulating film is deposited on the base substrate 10 on which the first gate 130 and the gate line 132 are formed, and then the insulating film is patterned to form a first gate insulating layer 120. The first gate insulating layer 120 comprises a first via hole 20 exposing a portion of the first gate 130 (a portion of the gate line 132 in the present embodiment). Then, a semiconductor layer film is deposited on the first gate insulating layer 120 and is patterned to form an active layer 15 through a patterning process. The active layer 15 at least partially overlaps with the first gate 130 in a direction perpendicular to the base substrate 10. For example, a channel region of the active layer 15 completely overlaps the first gate 130.

For example, material for the semiconductor layer film is amorphous silicon, polysilicon, metal oxide semiconductor, or the like. For example, the polysilicon can be high-temperature polysilicon or low-temperature polysilicon, and the oxide semiconductor can be IGZO, IZO, ZnO, GZO, or the like. For example, the active layer 15 can be formed as a single layer or multi-layer structure.

Figure 2E:
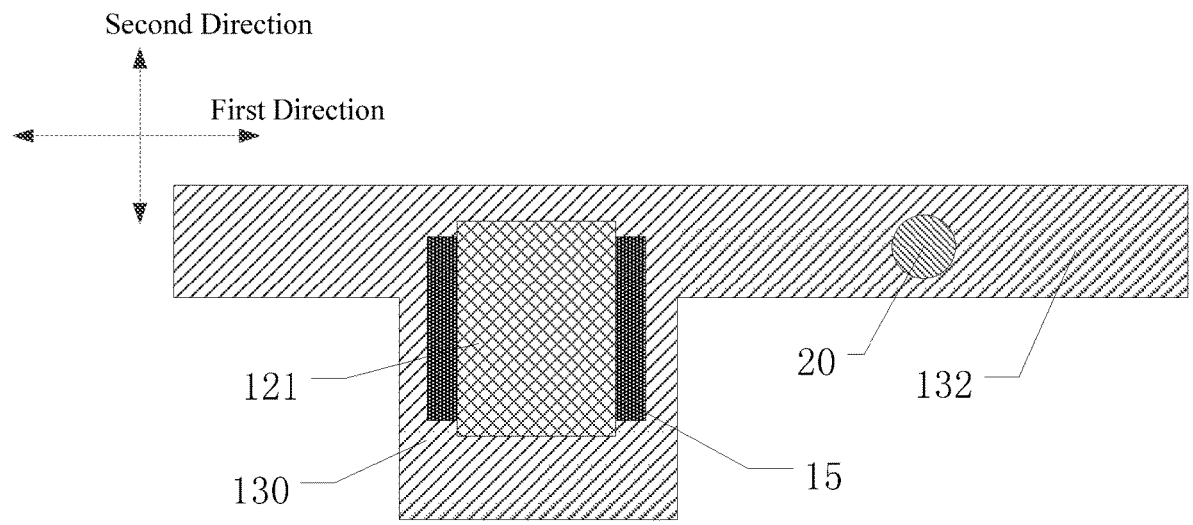
Figure 2F:
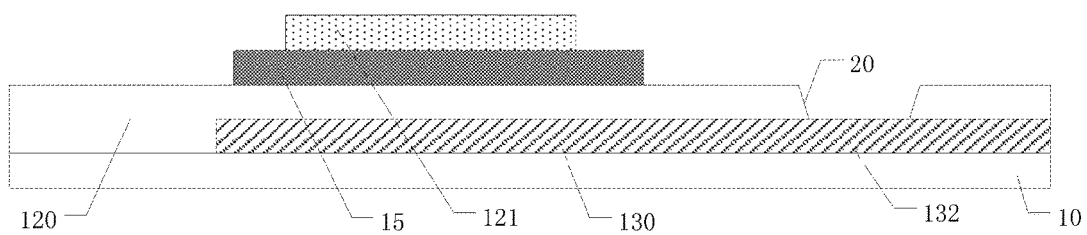

For example, as illustrated in FIGS. 2e and 2f, an insulating film is deposited on the active layer 15, and then the insulating film is patterned to form the second gate insulating layer 121. The second gate insulating layer 121 partially covers the active layer 15. In a first direction, the active layer 15 has a first end and a second end that are at least partially uncovered by the second gate insulating layer 121. And in the second direction, the second gate insulating layer 121 can completely cover the active layer 15.

Figure 2G:
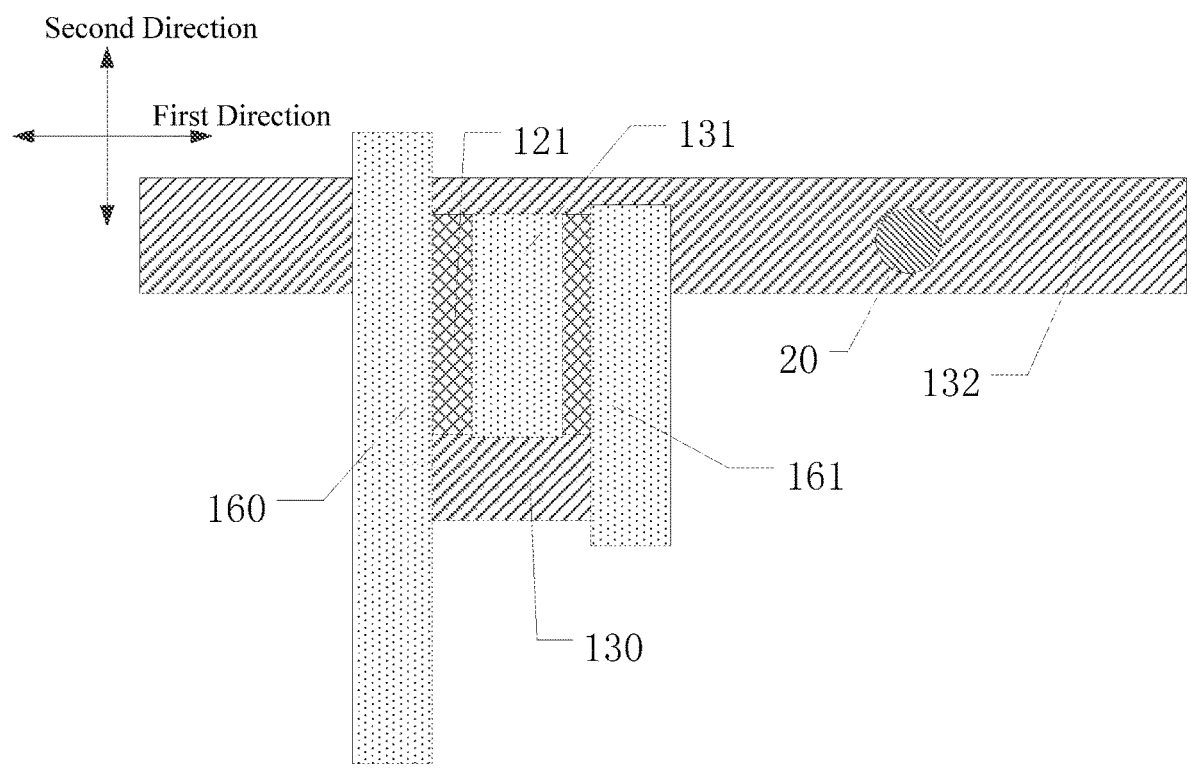
Figure 2H:
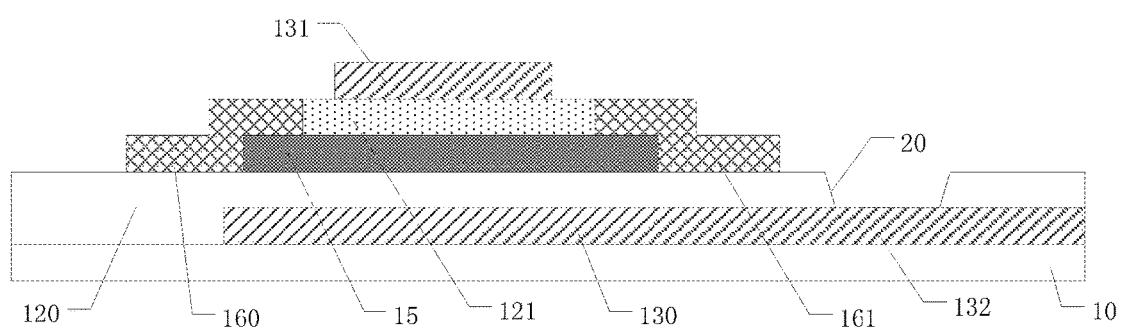

For example, as illustrated in FIGS. 2g and 2h, a metal film is deposited on the base substrate 10 on which the first gate 130, the first gate insulating layer 120, the active layer 15 and the second gate insulating layer 121 are formed, and then is patterned so as to form the second gate 131, the first electrode 160 and the second electrode 161 through a single patterning process. The first electrode 160 is formed to overlap with the active layer 15 through the exposed first end and the second electrode 161 is formed to overlap with the active layer 15 through the exposed second end. The second gate 131 is formed on the second gate insulating layer 121 and completely overlaps the channel region of the active layer 15 in a direction perpendicular to the base substrate 10, for example. In the first direction, the second gate 131 is located between the first electrode 160 and the second electrode 161. The method according to the present embodiment can save processes for forming the second gate 131 through the metal patterning process alone and for forming the insulating layer for protecting the second gate 131 through a deposition process, thereby reducing the number of layers and masks and shortening the production time and reducing production cost, and effectively improving production capacity and yield rate.

For example, material for the metal film can comprise one or more of the alloys formed by any one or more of molybdenum, copper, aluminum, nickel, or any combination of the above metals, or any other suitable materials. For example, the metal film can have a single-layer or multi-layer structure, and accordingly, the second gate 131, the first electrode 160, and the second electrode 161 can be formed as a single-layer or multi-layer structure.

Figure 2I:
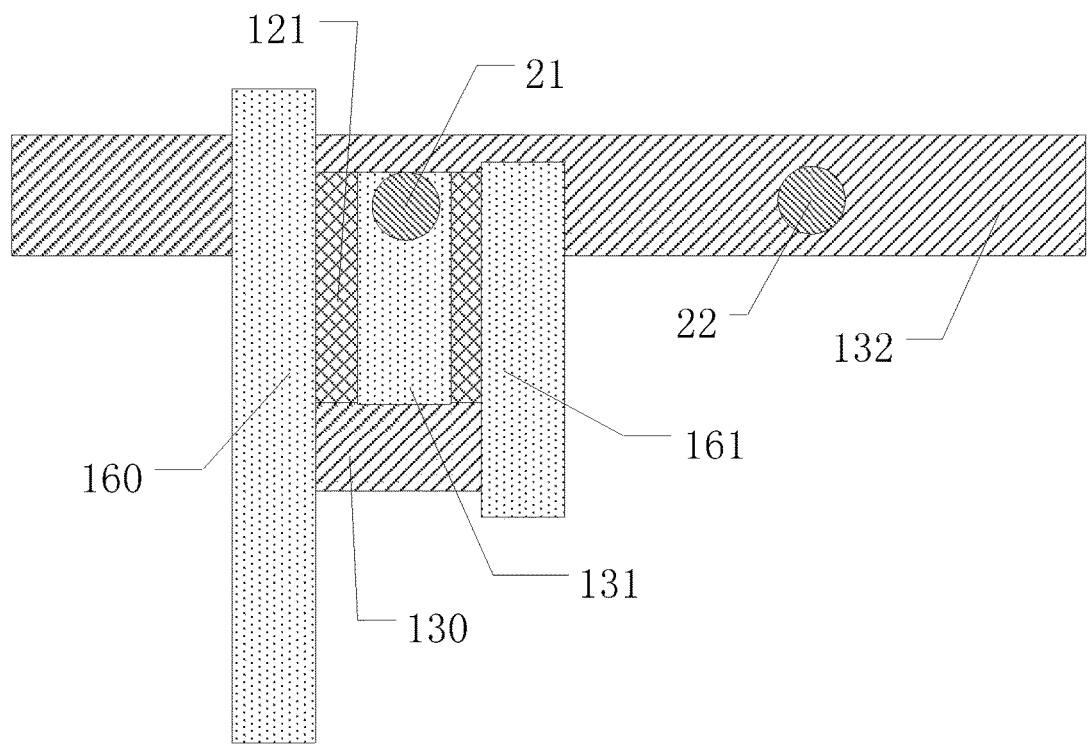
Figure 2J:
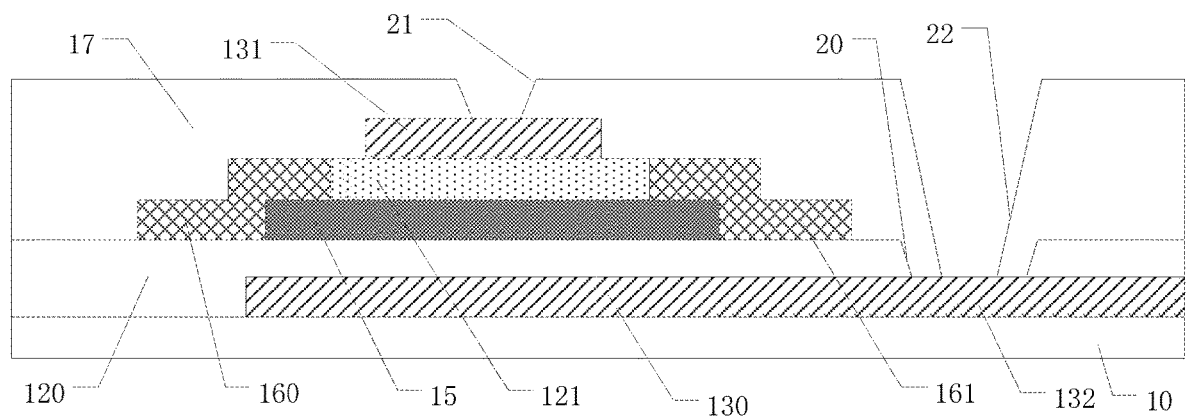

For example, as illustrated in FIGS. 2i and 2j, an insulating film is deposited on the second gate 131, the first electrode 160 and the second electrode 161, and the first passivation layer 17 is formed through a patterning process. The first passivation layer 17 comprises a second via hole 21 and a third via hole 22. The second via hole 21 exposes a portion of the second gate 131, and the third via hole 22 corresponds to the first via hole 20 formed in the first gate insulation layer 120, ie, exposing the first via hole 20.

For example, material for the first passivation layer 17 can comprise silicon oxide (SiOx), silicon nitride (SiNx), silicon oxynitride (SiOxNy), or the like. For example, the first passivation layer 17 can have a single-layer structure made of silicon nitride or silicon oxide, or a multi-layer structure made of silicon nitride and silicon oxide.

It should be noted that the first via hole 20 in the first gate insulating layer 120 and the third via hole 22 in the first passivation layer 17 form the third via hole 22 exposing a portion of the gate line 132. Of course, in a case where the first via hole 20 is not formed in the first gate insulating layer 120 in the previous step, the third via hole 22 can also be formed in the first gate insulating layer 120 and the first passivation layer 17 through one patterning process after forming the first passivation layer 17. Especially in a case where the first gate insulating layer 120 and the first passivation layer 17 are formed of the same material, a patterning process for forming the third via hole 22 becomes easier.

Figure 2K:
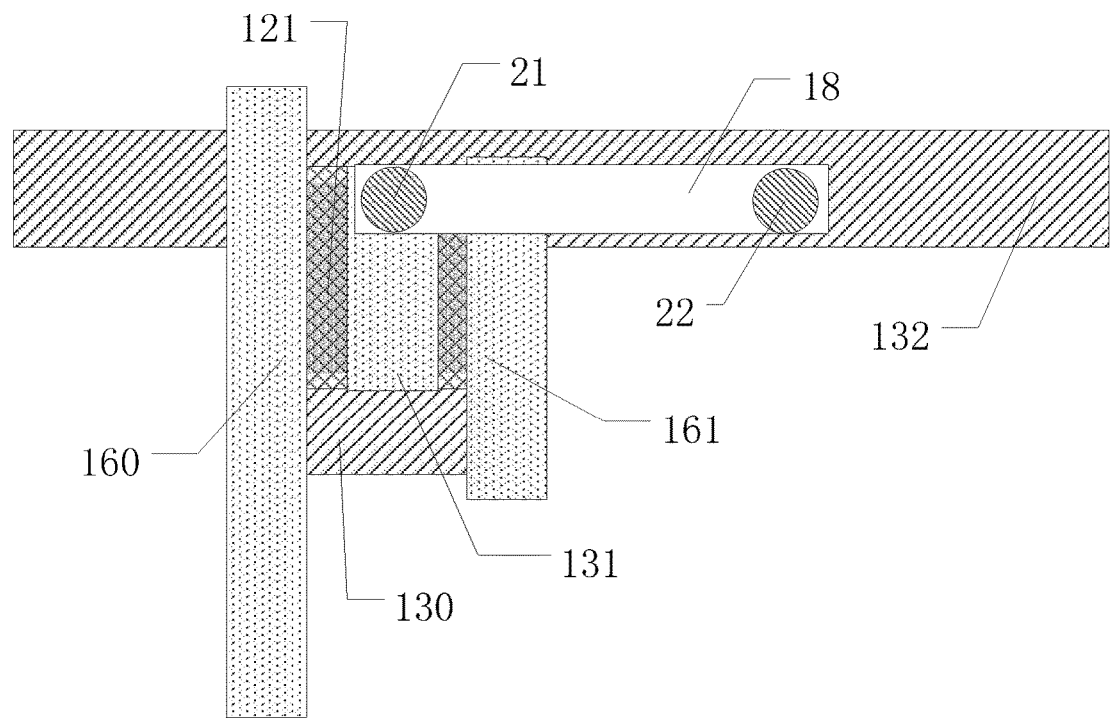
Figure 2L:
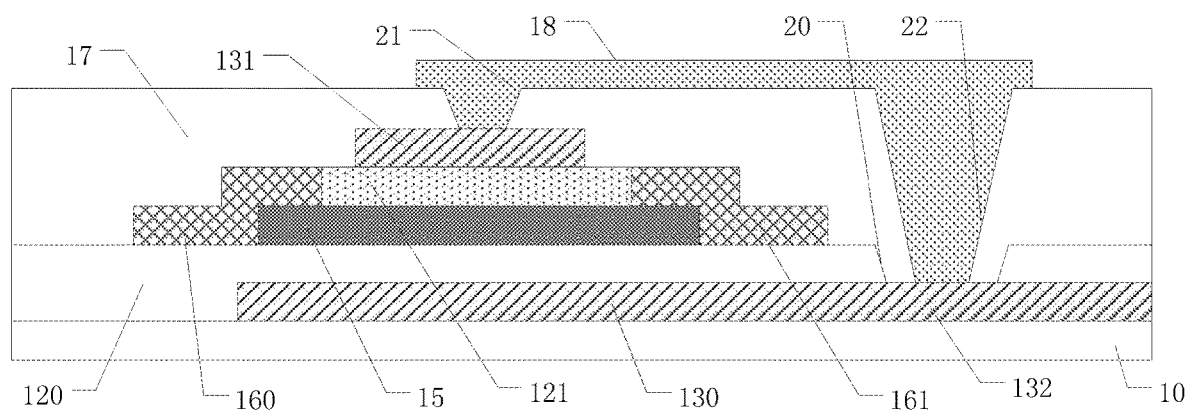

For example, as illustrated in FIGS. 2k and 2l, a transparent conductive film is deposited on the first passivation layer 17, and a connection electrode 18 is formed through a patterning process. The connection electrode 18 is electrically connected with the second gate 131 through the second via hole 21 and electrically connected with the gate line 132 through the third via hole 22 and the first via hole 20. As the first gate 130 and the gate line 132 are integrally formed, the first gate 130 and the second gate 131 are also electrically connected, and the first gate 130 and the second gate 131 are controlled by the same scanning signal transmitted on the gate line 132 to drive the active layer 15 so that the active layer 15 conducts the first electrode 160 and the second electrode 161 more steadily, thereby enhancing the stability of the dual-gate thin film transistor and improving the driving capacity of the dual gate thin film transistor and reducing drift in the device threshold voltage.

For example, material for the connection electrode 18 can be a transparent conductive material such as ITO, IZO, IGO, GZO, carbon nanotube, or the like. For example, the connection electrode 18 can be a single-layer or multi-layer structure made of the above material.

For example, the insulating film and the semiconductor film can be formed by chemical vapor deposition (CVD), physical vapor deposition (PVD) or the like. For example, the chemical vapor deposition can be plasma enhanced chemical vapor deposition (PECVD), low pressure chemical vapor deposition (LPCVD), or the like.

For example, the metal film and the transparent conductive film can be deposited through a vapor deposition method, a magnetron sputtering method, a vacuum evaporation method, or other suitable methods. Embodiments of the present disclosure are not limited thereto.

For example, examples of material for the first gate insulating layer 120 and the second gate insulating layer 121 can comprise silicon nitride (SiNx), silicon oxide (SiOx), silicon oxynitride (SiNxOy), or other suitable materials such as organic resins material. For example, both the first gate insulating layer 120 and the second gate insulating layer 121 can be a single-layer structure or multi-layer structure formed by one or more of the above materials.

Of course, in the embodiments of the present disclosure, the first via 20 and the third via 22 can be formed in one etching process. FIG. 2a1 to 2l1 illustrate an embodiment of the present disclosure, wherein the first via 20 and the third via 22 are formed in one etching process. Compared with the embodiment in which the first via 20 and the third via 22 are formed in different etching processes, in the embodiment as illustrated in FIG. 2a1 to 2l1, there is no via which exposes a portion of the first gate 130 formed in the structure as illustrated in FIG. 2c1, while in the structure as illustrated in FIG. 2j1, after forming the first passivation layer 17, the third via 22 is formed in the first passivation layer 17 and the first via 20 is formed in the first gate insulating layer 120 through one etching process, wherein the third via 22 exposes the first via 20, and the first via 20 exposes a portion of the first gate 130. Other processes, structures and materials in the embodiment as illustrated in FIG. 2a1 to 2l1 are the same as those in the embodiment as illustrated in FIG. 2a to 2l, and will not be elaborated here.

Figure 3A:
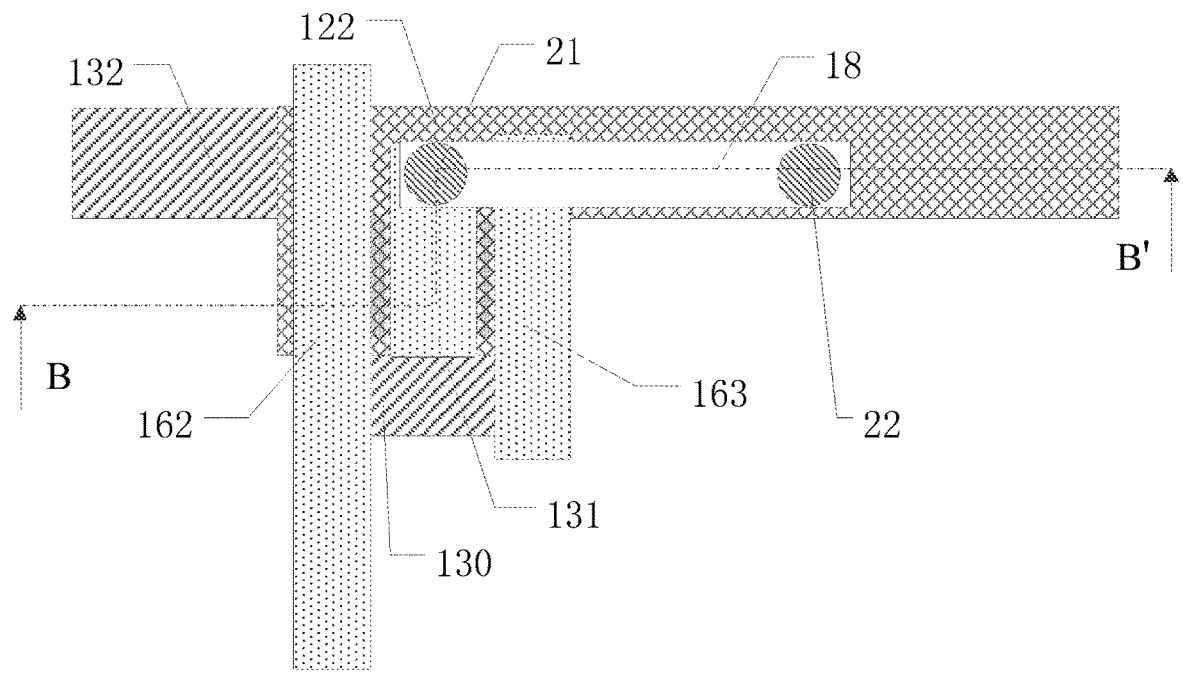
FIG. 3a is a plan view of a dual-gate thin film transistor according to another embodiment of the present disclosure.
Figure 3B:
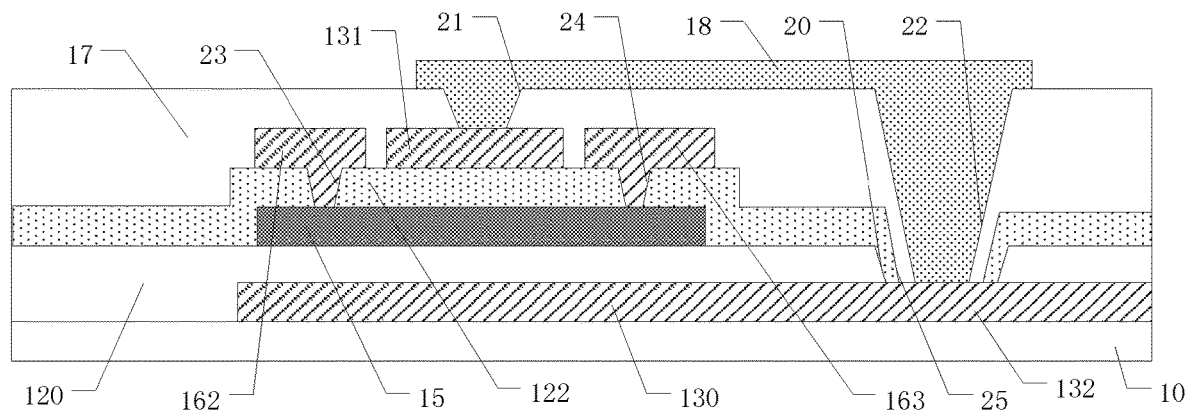

FIG. 3a illustrates a plan view of a dual-gate thin film transistor according to an embodiment of the present disclosure, FIG. 3b illustrates a cross-sectional view of the dual-gate thin film transistor taken along the line B-B' in FIG. 3a.

As illustrated in FIGS. 3a and 3b, in the dual-gate thin film transistor according to the embodiment, the second gate insulating layer 122 completely covers the active layer 15. The second gate insulating layer 122 comprises a fourth via hole 23, a fifth via hole 24, and a sixth via hole 25, wherein the fourth via hole 23 and the fifth via hole 24 exposes at least a portion of the active layer 15 and are located on respective sides of the second gate 131, and the sixth via hole 25 exposes the first via hole 20. The second gate 131, the first electrode 162 and the second electrode 163 are formed on the second gate insulating layer 122 through one patterning process, and the first electrode 162 is electrically connected with the active layer 15 through the fourth via hole 23, and the second electrode 163 is electrically connected with the active layer 15 through the fifth via hole 24. The second gate 131 and the active layer 15 at least partially overlap in a direction perpendicular to the base substrate 10. The first passivation layer 17 covers the second gate 131, the first electrode 162 and the second electrode 163. The first passivation layer 17 comprises a second via hole 21 exposing a portion of the second gate 131 and a third via hole 22 exposing the sixth via hole 25. The connection electrode 18 is disposed on the first passivation layer 17 and electrically connected with the second gate 131 through the second via hole 21, and is electrically connected with the gate line 132 through the third via hole 22, the sixth via hole 25 and the first via hole 20. The structures of the remaining layers of the dual-gate thin film transistor according to the embodiment are the same as those in the first embodiment, and the respective layers can be prepared by using the materials described in the last embodiment.

For example, in a method for making the dual-gate thin film transistor according to the present embodiment, after forming the active layer 15, an insulation film is deposited on the active layer 15 and is patterned to form a second gate insulation layer 122. The second gate insulation layer 122 completely covers the active layer 15 and comprises a fourth via hole 23 and a fifth via hole 24 exposing at least a portion of the active layer 15, and a sixth via hole 25 exposing the first via hole 20. Next, a metal film is deposited on the second gate insulating layer 122 and is patterned to form a first electrode 162, a second electrode 163 and a second gate 131. The first electrode 162 is formed at the fourth via hole 23 and is electrically connected with the active layer 15 through the fourth via hole 23. The second electrode 163 is formed at the fifth via hole 24 and is electrically connected with the active layer 15 through the fifth via hole 24. The second gate 131 at least partially overlaps the active layer 15 in a direction perpendicular to the base substrate 10. In a direction parallel to the base substrate, the fourth via hole 23 and the fifth via hole 24 are located on respective sides of the second gate 131. A first passivation layer 17 covering the first electrode 162, the second electrode 163 and the second gate 131 is then formed on the first electrode 162, the second electrode 163 and the second gate 131. And the first passivation layer 17 comprises a second via hole 21 exposing a portion of the second gate 131, and a third via hole 22 exposing the sixth via hole 25. The remaining layers in the present embodiment can be formed by the same preparation method as in the last embodiment, and the details will not be elaborated.

In the structure as illustrated in FIG. 3b, the first via 20 formed in the first gate insulating layer 120, the sixth via 25 formed in the second insulating layer 122 and the third via 22 formed in the first passivation layer 17 are respectively formed in different etching processes. Of course, the first via 20, the sixth via 25 and the third via 22 can be formed through one etching process. As illustrated in FIG. 3b2, the first gate insulating layer and the second gate insulating are not etched before forming the first passivation layer 17. And after forming the first passivation layer 17, the third via 22 in the first passivation layer 17, the sixth via 25 in the second gate insulating layer and the first via 20 in the first gate insulating layer are formed by etching the first passivation layer 17, the second gate insulating layer and the first gate insulating layer through one etching process. And at the same time, a second via 21 exposing a portion of the second gate 131 is formed in the first passivation layer 17, as illustrated in FIG. 3b1.

Figure 4A:
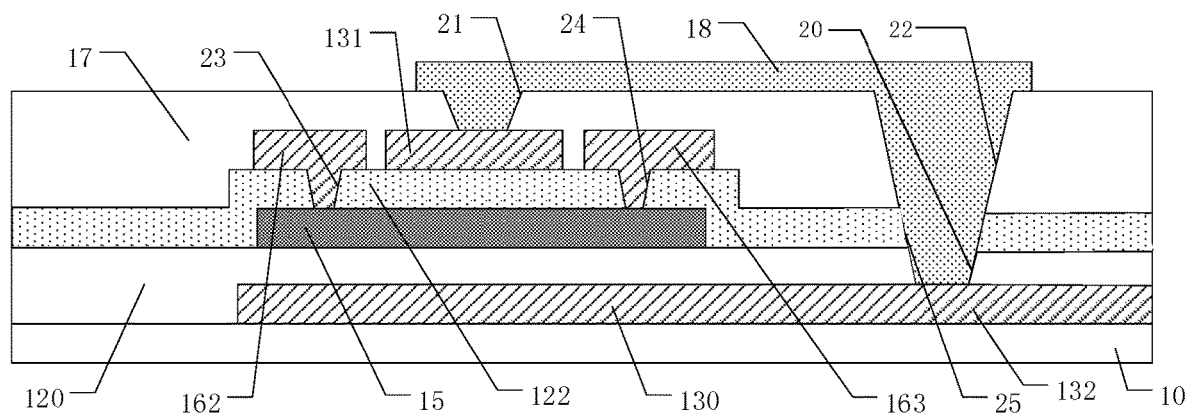
FIG. 4a is a plan view of a dual-gate thin film transistor according to still another embodiment of the present disclosure.
Figure 4A:
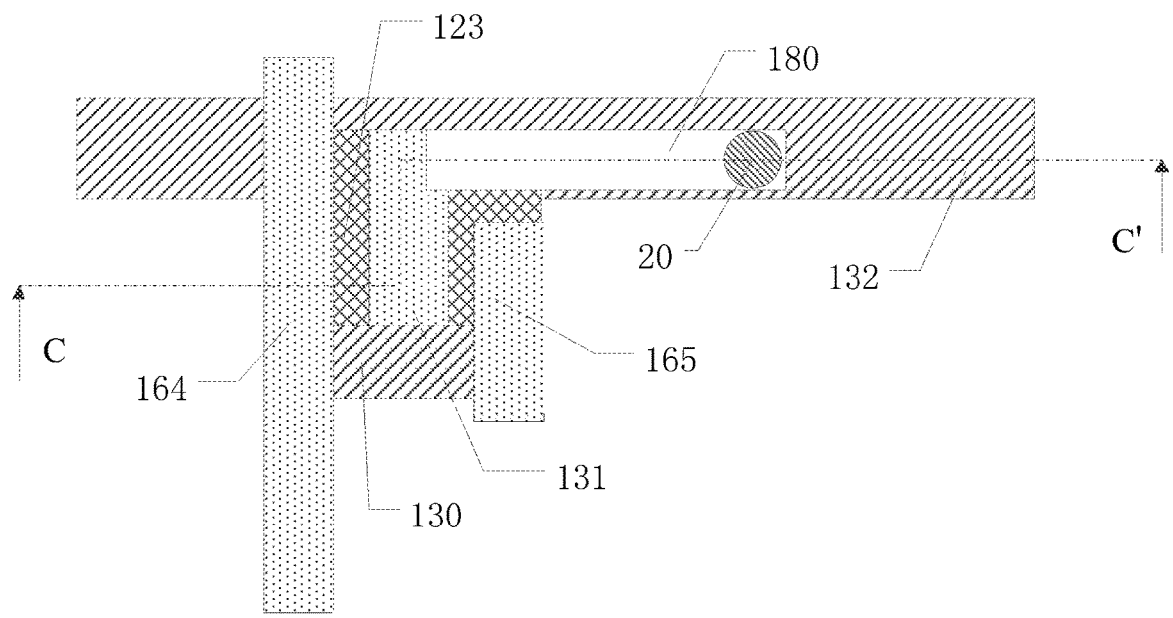
Figure 4B:
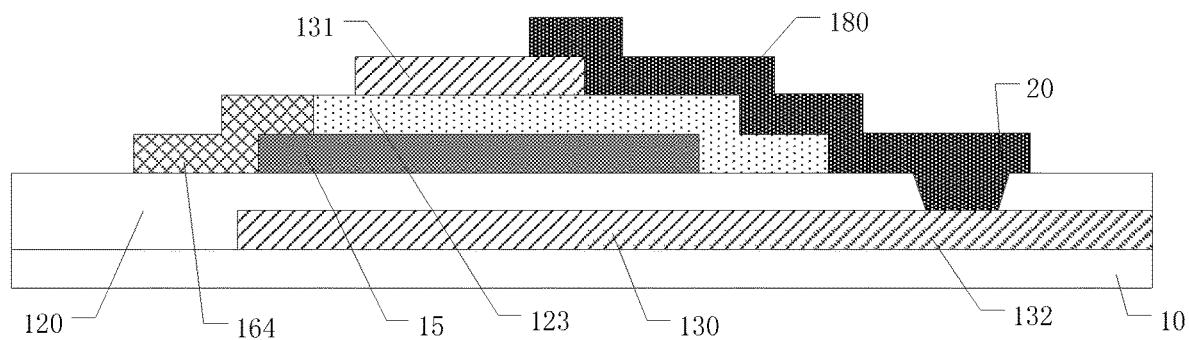

FIG. 4a illustrates a plan view of a dual-gate thin film transistor according to an embodiment of the present disclosure, and FIG. 4b is a cross-sectional view of the dual-gate thin film transistor taken along the line C-C' in FIG. 4a. In the first embodiment and the second embodiment, the connection electrode 18 is disposed on the first passivation layer 17, while in the present embodiment, as illustrated in FIGS. 4a and 4b, the connection electrode 180 is disposed on the second gate insulating layer 123 The connection electrode 180 is overlapped with the second gate 131 and is electrically connected with the gate line 132 through the first via hole 20. In the present embodiment, the first passivation layer 17 is saved, the connection electrode 180 is insulated from the active layer 15 and the second electrode 165 by the second gate insulating layer 123, thus the films can be further reduced and the manufacturing processes can be simplified, thereby reducing production costs and improving productivity. The remaining layers of the dual-gate thin film transistor of the present embodiment can have the same structure as that in the last embodiments, and the present invention is not limited thereto.

For example, the method for manufacturing a dual-gate thin film transistor according to the present embodiment can be the same as that of the first embodiment before forming the active layer 15. After forming the active layer 15, an insulating layer is deposited on the active layer 15 and is patterned to form the second gate insulating layer 123 through a patterning process; next, a metal film is deposited on the second gate insulating layer 123 and is patterned to form a second gate 131, a first electrode 164 and a second electrode 165 through a patterning process; and then, a transparent conductive film is still deposited on the second gate insulating layer 123, and is patterned to form the connection electrode 180 through a patterning process. The connection electrode 180 is overlapped with the second gate 131 and is electrically connected with the gate line 132 through the first via hole 20, so that the connection electrode 180 can be electrically connected with the first gate 130 and the second gate 131. The second gate 131 at least partially overlaps with the active layer 15 in a direction perpendicular to the base substrate 10. The connection between the first electrode 164 and the second electrode 165 and the active layer 15 can be the same as the last embodiments.

In the present embodiment, an array substrate is provided, which comprises the dual-gate thin film transistor according to any one of the above embodiments. The array substrate according to the present embodiment of the disclosure can comprise a plurality of gate lines and a plurality of data lines crossing each other to define a plurality of pixel units, and the plurality of pixel units can be arranged in a matrix. Each pixel unit comprises a thin film transistor as a switching element.

Figure 5A:
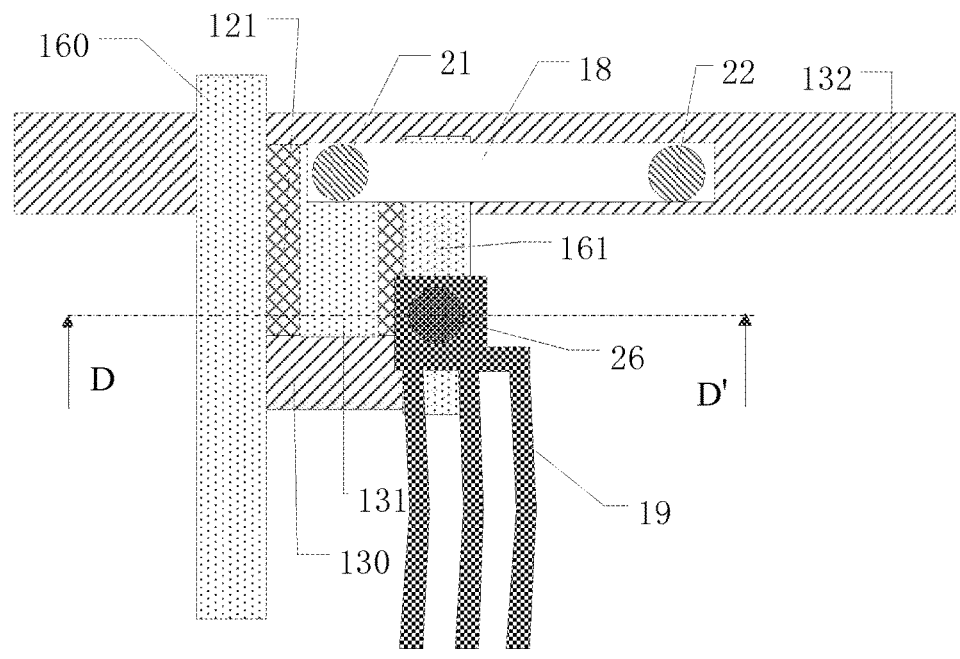
FIG. 5a is a plan view of an array substrate according to an embodiment of the present disclosure.
Figure 5B:
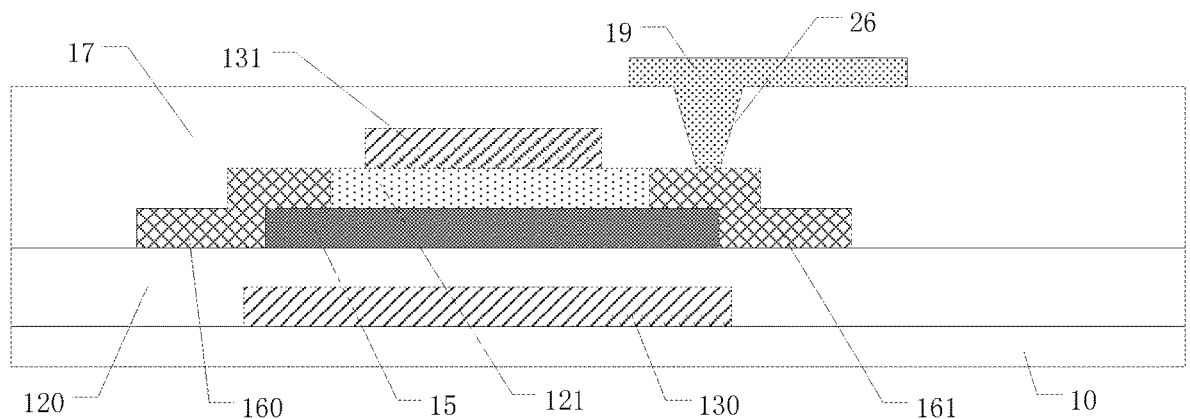
Figure 6:
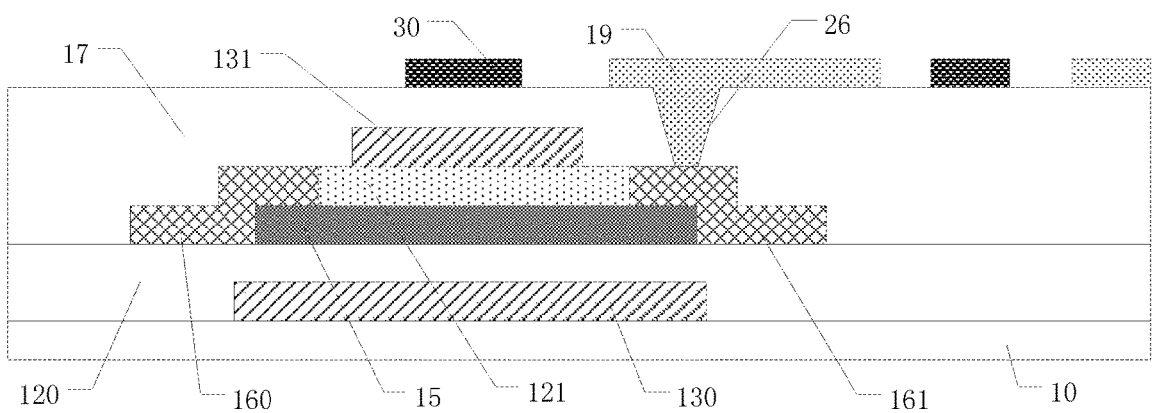
FIG. 6 is an illustrative cross-sectional structure view of an array substrate according to another embodiment of the present disclosure.
Figure 7:
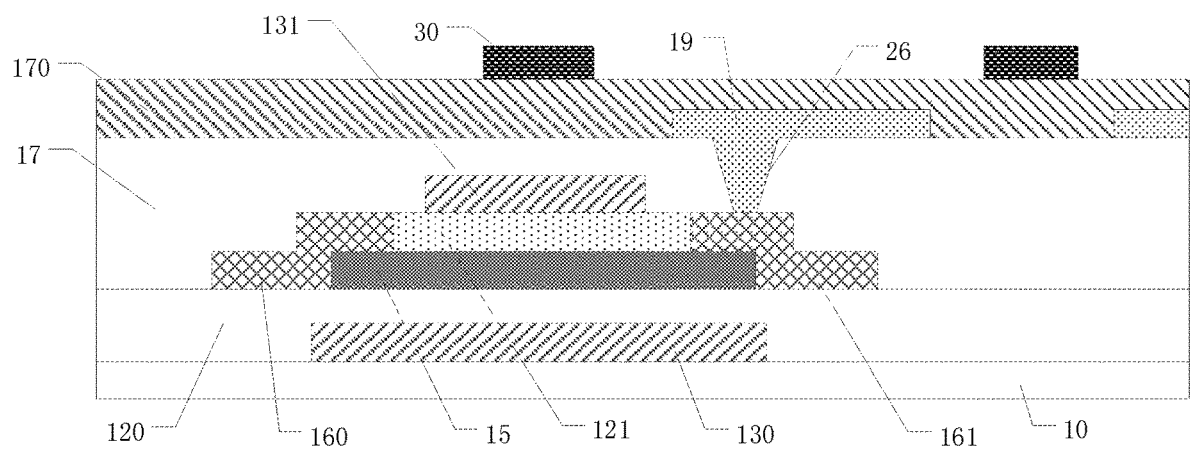
FIG. 7 is an illustrative cross-sectional structure view of an array substrate according to still another embodiment of the present disclosure.

For example, FIG. 5a illustrates a plan view of an array substrate according to the present embodiment, FIG. 5b illustrates a cross-sectional structure view of the array substrate taken along the line D-D' in FIG. 5a, and FIG. 6 illustrates a cross-sectional structure view of another array substrate according to the present embodiment, and FIG. 7 illustrates a cross-sectional structure view of still another array substrate according to the present embodiment.

For example, the array substrate according to the present embodiment can further comprise a gate line 132, which is electrically connected with the first gate 130. As illustrated in FIGS. 5a and 5b, in the present embodiment, the gate line 132 and the first gate 130 are formed integrally. The first passivation layer 17 comprises a second via hole 21 exposing a portion of the second gate 131 and a third via hole 22 exposing a portion of the gate line 132. The connection electrode 18 is electrically connected with the second gate 131 through the second via hole 21 and is electrically connected with the gate line 132 through the third via hole 22 so that the first gate 130 and the second gate 131 can receive the scanning signal transmitted on the gate line 132 at the same time, thereby ensuring that the active layer 15 is collectively driven by the first gate 130 and the second gate 131, optimizing the responding speed of the dual-gate thin film transistor and guaranteeing the stability of the dual-gate thin film transistor.

For example, as illustrated in FIGS. 5a and 5b, the array substrate according to the present embodiment can further comprise a pixel electrode 19, and the pixel electrode 19 and the connection electrode 18 are disposed on the same level. The first passivation layer 17 further comprises a seventh via hole 26 exposing a portion of the second electrode 161. The pixel electrode 19 is electrically connected with the second electrode 161 through the seventh via hole 26. For example, the pixel electrode 19 can be a slit electrode or a plate electrode.

For example, the array substrate according to the present embodiment can further comprise a common electrode 30. As illustrated in FIG. 6, the common electrode 30 is disposed on the first passivation layer 17, and the common electrode 30 can be formed on the same level as the pixel electrode 19 and the connection electrode 18. For example, both the pixel electrode 19 and the common electrode 30 are slit electrodes, and branches of the pixel electrode 19 and branches of the common electrode 30 are alternately arranged with each other. For example, as illustrated in FIG. 7, the common electrode 30 and the pixel electrode 19 can be formed on different levels, the pixel electrode 19 is disposed on the first passivation layer 17, and a second passivation layer 170 is further formed on the pixel electrode 19. The common electrode 30 is disposed on the second passivation layer 170, both the pixel electrode 19 and the common electrode 30 can be slit electrodes, and the slits of the both can overlap with each other or be interleavingly arranged with each other, for example. For example, the order of forming the pixel electrode 19 and the common electrode 30 can be reversed, that is, the common electrode 30 can be disposed on the first passivation layer 17 with the connection electrode 18 and the pixel electrode 19 disposed over the common electrode 30 and the connection electrode 18. For example, the pixel electrode 19 can be disposed on the second passivation layer 170.

In the present embodiment, the pixel electrode 19 and/or the common electrode can be formed on a same level as the connection electrode 18 to further reduce the films in the array substrate and the number of masks, thereby shortening the preparation time, reducing the process complexity, reducing the production cost, and effectively improving productivity.

For example, the pixel electrode 19 and/or the common electrode 30 can be formed of the same material as the connection electrode 18.

In the above description of the structure of the array substrate, the dual-gate thin film transistor according to the first embodiment is taken as an example for description. However, those skilled in the art should understand that the dual-gate thin film transistors according to other embodiments of the present disclosure are also applicable to the array substrate according to embodiments of the disclosure.

It should be noted that, for the sake of clarity, the entire structure of the array substrate will not be described in detail. To achieve the necessary functions of the array substrate, one of ordinary skill in the art can configure other structures not described according to specific application scenarios, which are not limited in the present disclosure.

The present embodiment provides a display device, which comprises the array substrate according to the last embodiments. The display device can be any product or component having a display function such as a television, a digital camera, a cell phone, a watch, a tablet computer, a laptop computer, a navigator and the like.

For example, one example of such a display device is a liquid crystal display device that comprises an array substrate and a counter substrate that are disposed opposite to each other to form a liquid crystal cell in which a liquid crystal material is filled. The counter substrate is, for example, a color filter substrate. The pixel electrode in each pixel unit of the array substrate is configured to apply an electric field to control the degree of rotation of the liquid crystal material so as to display. Typically, the liquid crystal display device comprises a backlight source, which is provided on the rear side of the array substrate with respect to the counter substrate, for example.

For example, another example of the display device is an organic light emitting diode (OLED) display device. Organic light emitting diodes are formed on the array substrate of the OLED display device. The pixel electrode of each pixel unit can serve as an anode or a cathode of the organic light emitting diode, or can be electrically connected with the anode or the cathode of the organic light emitting diode to drive the organic light emitting diode to emit light so as to perform display.

For example, another example of the display device is an electronic paper display device. An electronic ink layer is formed on an array substrate of an electronic paper display device, and a pixel electrode of each pixel unit applies a voltage which is intended to drive the charged microparticles in the electronic ink to perform display.

In the present disclosure, the followings are needed to be explained:

(1) The drawings of the embodiments of the present disclosure just relate to the structures involved in the embodiments of the present disclosure, and other structures can refer to the common designs.

(2) For the sake of clarity, in the drawings describing embodiments of the present disclosure, the thicknesses of layers or regions are enlarged or reduced, that, these drawings are not drawn to actual scale.

Without conflict, the embodiments of the present disclosure and the features in the embodiments can be combined with each other to obtain a new embodiment.

The foregoing are merely exemplary embodiments of the disclosure, but are not used to limit the protection scope of the disclosure. The protection scope of the disclosure shall be defined by the attached claims.

The invention claimed is:

1. A dual-gate thin film transistor, comprising:
a base substrate;
a first gate disposed on the base substrate;
a first gate insulating layer disposed on the first gate, the first gate insulating layer comprising a first via hole exposing a portion of the first gate;
an active layer disposed on the first gate insulating layer, the active layer and the first gate at least partially overlapping with each other in a direction perpendicular to the base substrate;
a second gate insulating layer disposed on the active layer;
a first electrode and a second electrode, which are disposed in contact with the active layer;
a second gate disposed on the second gate insulating layer, the second gate and the active layer at least partially overlapping with each other in a direction perpendicular to the base substrate, and the second gate, the first electrode and the second electrode formed in a same level;
a connection electrode electrically connected with the second gate and electrically connected with the first gate through the first via hole; and
a first passivation layer, wherein the first passivation layer is disposed on the second gate, the first passivation layer comprises a third via hole exposing the first via hole, and an area of an orthographic projection of the first via hole on the base substrate is larger than an area of an orthographic projection of the third via hole on the base substrate, and the orthographic projection of the third via hole on the base substrate is within the orthographic projection of the first via hole on the base substrate.

2. The dual-gate thin film transistor according to claim 1, wherein the first passivation layer comprises a second via hole exposing a portion of the second gate, the connection electrode is disposed on the first passivation layer, is electrically connected with the second gate through the second via hole and electrically connected with the first gate through the third via hole and the first via hole.

3. The dual-gate thin film transistor according to claim 1, wherein the first electrode and the second electrode are disposed on the second gate insulating layer, the second gate insulating layer comprises a fourth via hole and a fifth via hole which expose at least a portion of the active layer and are located on respective sides of the second gate, the first electrode is electrically connected with the active layer through the fourth via hole, and the second electrode is electrically connected with the active layer through the fifth via hole.

4. The dual-gate thin film transistor according to claim 1, wherein the second gate insulating layer partially covers the active layer, in a direction parallel to the base substrate, on both sides of the second gate, the active layer has a first end and a second end which are at least partially uncovered by the second gate insulating layer, the first electrode overlaps with the active layer through the first end, and the second electrode overlaps with the active layer through the second end.

5. The dual-gate thin film transistor according to claim 1, wherein the connection electrode is made of a transparent conductive material.

6. The dual-gate thin film transistor according to claim 1, wherein the second gate, the first electrode and the second electrode can be made of one or more selected from a group consisting of molybdenum, molybdenum alloy, copper, copper alloy, aluminum, aluminum alloy, titanium and titanium alloy.

7. The dual-gate thin film transistor according to claim 1, wherein the active layer is an amorphous silicon layer, a polysilicon layer, or a metal oxide semiconductor layer.

8. An array substrate, comprising the dual-gate thin film transistor according to claim 1.

9. The array substrate according to claim 8, further comprising a gate line disposed on the base substrate, wherein
the gate line is electrically connected with the first gate, and the connection electrode is electrically connected with the second gate and is electrically connected with the gate line through the first via hole.

10. The array substrate according to claim 8, further comprising at least one of a pixel electrode and a common electrode, wherein
at least one of the pixel electrode and the common electrode is formed on a same level as the connection electrode.

11. The array substrate according to claim 10, wherein the common electrode and the pixel electrode are formed on a same level or on different levels.

12. A method for manufacturing a dual-gate thin film transistor, comprising:
providing a base substrate;
forming a first gate on the base substrate;
forming a first gate insulating layer on the first gate;
forming an active layer on the first gate insulating layer, the active layer partially overlapping the first gate in a direction perpendicular to the base substrate;
forming a second gate insulating layer on the active layer;
forming a second gate, a first electrode and a second electrode through one conductive layer, wherein the second gate is disposed on the second gate insulating layer and partially overlaps the active layer in a direction perpendicular to the base substrate, and both the first electrode and the second electrode are in contact with the active layer; and forming a connection electrode, which is electrically connected with the second gate and is electrically connected with the first gate;

forming a first passivation layer;

forming a first via hole exposing a portion of the first gate in the first gate insulating layer; and forming a third via hole exposing a portion of the first via hole in the first passivation layer, wherein an area of an orthographic projection of the first via hole on the base substrate is larger than an area of an orthographic projection of the third via hole on the base substrate, and the orthographic projection of the third via hole on the base substrate is within the orthographic projection of the first via hole on the base substrate.

13. The method according to claim 12, further comprising:

forming a second via hole in the first passivation layer wherein the second via hole at least partially exposes the second gate, and the connection electrode is electrically connected with the second gate through the second via hole and is electrically connected with the first gate through the third via hole and the first via hole.

14. The method according to claim 12, wherein the connection electrode is made of a transparent conductive film.

15. A display device, comprising the array substrate according to claim 8.

16. The method according to claim 13, wherein the first via and the third via are formed through one etching process, or the first via and the third via are formed through different etching processes.

17. The method according to claim 12, wherein the second gate insulating layer covers a portion of the active layer, two opposite ends of the active layer are exposed, and the first electrode and the second electrode are in direct contact with the exposed ends of the active layer respectively.

18. The method according to claim 12, wherein the second gate insulating layer covers entirety of the active layer, the method further comprising forming a fourth via and a fifth via in the second gate insulating layer, the first electrode electrically connected to the active layer through the fourth via and the second electrode electrically connected to the active layer through the fifth via.

19. The method according to claim 12, wherein the second gate insulating layer covers a portion of the active layer and one end of the active layer is exposed, the connection electrode is in direct contact with the second gate and is extended on the second gate insulating layer and the first gate insulating layer, and is electrically connected to the first gate through the first via hole in first gate insulating layer.

20. The dual-gate thin film transistor according to claim 2, wherein the first electrode and the second electrode are disposed on the second gate insulating layer, the second gate insulating layer comprises a fourth via hole and a fifth via hole which expose at least a portion of the active layer and are located on respective sides of the second gate, the first electrode is electrically connected with the active layer through the fourth via hole, and the second electrode is electrically connected with the active layer through the fifth via hole.

* * * * *